(12) United States Patent
Pelley

(10) Patent No.: US 8,848,480 B1
(45) Date of Patent: Sep. 30, 2014

(54) SYNCHRONOUS MULTIPLE PORT MEMORY WITH ASYNCHRONOUS PORTS

(71) Applicant: Perry H. Pelley, Austin, TX (US)

(72) Inventor: Perry H. Pelley, Austin, TX (US)

(73) Assignee: Freescale Semiconductor, Inc., Austin, TX (US)

( * ) Notice: Subject to any disclaimer, the term of this patent is extended or adjusted under 35 U.S.C. 154(b) by 0 days.

(21) Appl. No.: 13/873,988

(22) Filed: Apr. 30, 2013

(51) Int. Cl.
*G11C 8/16* (2006.01)
*G11C 7/10* (2006.01)
*G11C 7/22* (2006.01)

(52) U.S. Cl.
CPC ............... *G11C 8/16* (2013.01); *G11C 7/1075* (2013.01); *G11C 7/22* (2013.01)
USPC ............ 365/230.05; 365/189.04; 365/230.06; 365/233.11

(58) Field of Classification Search
CPC ........... G11C 7/22; G11C 7/1075; G11C 8/16
USPC ............. 365/230.05, 189.04, 230.02, 230.06, 365/233.1, 233.11
See application file for complete search history.

(56) References Cited

U.S. PATENT DOCUMENTS

| | | | |
|---|---|---|---|
| 5,781,480 A | 7/1998 | Nogle et al. | |
| 6,029,252 A * | 2/2000 | Manning | 713/600 |
| 6,078,527 A | 6/2000 | Roth et al. | |
| 6,181,634 B1 | 1/2001 | Okita | |
| 6,473,357 B1 | 10/2002 | Fan et al. | |
| 6,625,699 B2 | 9/2003 | Cohen et al. | |
| 6,816,955 B1 | 11/2004 | Raza et al. | |
| 6,845,059 B1 | 1/2005 | Wordeman et al. | |
| 6,873,565 B1 | 3/2005 | Riedlinger et al. | |
| 7,054,217 B2 | 5/2006 | Yamada | |
| 7,184,359 B1 | 2/2007 | Bridgewater et al. | |
| 7,206,251 B1 | 4/2007 | Yu | |
| 7,369,453 B2 * | 5/2008 | Kim | 365/230.05 |
| 7,453,738 B2 * | 11/2008 | Taruishi et al. | 365/189.05 |
| 7,533,222 B2 | 5/2009 | Leung | |
| 7,564,738 B2 | 7/2009 | Pelley et al. | |
| 7,573,753 B2 | 8/2009 | Atwood et al. | |
| 7,808,847 B2 | 10/2010 | Wang et al. | |
| 7,894,296 B2 | 2/2011 | Lee et al. | |
| 7,911,825 B2 * | 3/2011 | Matsuzaki et al. | 365/149 |
| 7,940,599 B2 | 5/2011 | Lu et al. | |

OTHER PUBLICATIONS

Chang, M. et al., "Wide VDD Embedded Asynchronous SRAM With Dual-Mode Self-Timed Technique for Dynamic Voltage Systems", IEEE Transactions on Circuits and Systems I: Regular Papers, vol. 56, No. 8, Aug. 2009, pp. 1657-1667.

(Continued)

*Primary Examiner* — Tan T. Nguyen
(74) *Attorney, Agent, or Firm* — Joanna G. Chiu; James L. Clingan, Jr.

(57) ABSTRACT

A method of operating a multiport memory, which has first and second sets of word lines and bit lines for accessing a memory array, uses a first port and a second port for accesses during a first phase of a master clock and a third port and a fourth port during a second phase of the master clock. Each port has its own port clock, which clocks their own row and column addresses, that is no faster than the master clock. Assuming there is demand for it, four accesses occur for each cycle of the master clock. This has the effect of being able to be sure that a given access is complete within two cycles of the port clocks and can be operated at the rate of one access per cycle of the port clock.

20 Claims, 10 Drawing Sheets

(56) References Cited

OTHER PUBLICATIONS

Endo, K. et al., "Pipelined, Time-Sharing Access Technique for an Integrated Multiport Memory", IEEE Journal of Solid-State Circuits, vol. 26, No. 4, Apr. 1991, pp. 549-554.

Ishii, Y. et al., "A 28-nm dual-port SRAM macro with active bitline equalizing circuitry against write disturb issue", 2010 IEEE Symposium on VLSI Circuits, Jun. 16-18, 2010, pp. 99-100.

Johnston, C.T., et al., "FPGA implementation of a Single Pass Connected Components Algorithm", 4th IEEE International Symposium on Electronic Design, Test & Applications, May 2008, pp. 228-231.

Lee, H., "Design of Ultra Low Power Pseudo-Asynchronous SRAM", Twelfth Annual IEEE International ASIC/SOC Conference, Sep. 15-18, 1999, p. 275.

Muttersbach, J. et al., "Globally-Asynchronous Locally-Synchronous Architectures to Simplify the Design of On-Chip Systerms", Twelfth Anuual IEEE International ASIC/SOC Conference, 1999, pp. 317-321.

Nakase, Y. et al., "A 300MHz Dual Port Graphics RAM using Port Swap Architecture", ISSCC97/Session 24/Non-Volatile Memory and SRAM/Paper SP 24.3, IEEE International Solid State Circuits Conference, Feb. 8, 1997, pp. 400-401.

Nii, K. et al., "Synchronous Ultra-High-Density 2RW Dual-Port 8T-SRAM with Circumvention of Simultaneous Common-Row-Access", IEEE Journal of Solid-State Circuits, vol. 44, No. 3, Mar. 2009, pp. 977-986.

Pilo, H. et al., "A 5.6ns Random Cycle 144Mb DRAM with 1.4b/s/pin and DDR3-SRAM Interface", ISSCC 2003/ Session 17/SRAM and DRAM/Paper 17.5, IEEE International Solid-State Circuits Conference, Feb. 12, 2003, 11 pgs.

Soon-Hwei, T. et al., "A 160-Mhz 45-mW Asynchronous Dual-Port 1-Mb CMOS SRAM", 2005 IEEE Conference on Electron Devices and Solid-State Circuits, Dec. 19-21, 2005, pp. 351-354.

U.S. Appl. No. 13/740,862, Pelley, P.H., "Multiport Memory With Matching Address and Data Line Control", filed Jan. 14, 2013.

U.S. Appl. No. 13/740,868, Pelley, P.H., "Multiport Memory With Matching Address Control", filed Jan. 14, 2013.

U.S. Appl. No. 13/483,764, Pelley, P.H., et al., "Multi-Port Register File with Multiplexed Data", filed May 30, 2012.

U.S. Appl. No. 13/780,101, Pelley, P.H., et al., "Synchronous Multiple Port Memory With Asynchronous Ports", filed Feb. 28, 2013.

Heshami, M. et al., "A 250-MHz Skewed-Clock Pipelined Dual-Port Embedded DRAM", Proceedings of the IEEE Custom Integrated Circuits Conference, May 1-4, 1995, pp. 143-146.

Johguchi, K. et al., "A 0.6-Tbps, 16-Port SRAM Design with 2-Stage Pipeline and Multi-Stage-Sensing Scheme", 33rd European Solid State Circuits Conference, 2007, pp. 320-323.

* cited by examiner

SYNCHRONOUS MULTIPLE PORT MEMORY WITH ASYNCHRONOUS PORTS

BACKGROUND

1. Field

This disclosure relates generally to synchronization, and more specifically, to a synchronous multiple port memory with asynchronous ports.

2. Related Art

Along with recent advancements of semiconductor technologies, smaller-size and larger-capacity memories that allow high-speed reading/writing operations have been developed. Further, a so-called multiport memory including plural input ports and output ports has been used for reading/writing data of different addresses.

Multi-port memories, by providing access to the storage element of memory cells to more than one resource, such as in the case of multi-core processor or an interface between a processor and a bus, have become more commonly used. One of the issues with multi-port memories is how to coordinate this aspect of providing access to more than one resource. Often this ability is achieved using wait states and/or arbitration. This can result in unpredictable access times which is undesirable.

Accordingly there is a need for a multi-port memory that improves upon one or more of the issues discussed above. Furthermore, in some scenarios, it is necessary for a synchronous memory to interface to other logic units having different operating frequencies.

BRIEF DESCRIPTION OF THE DRAWINGS

The present invention is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
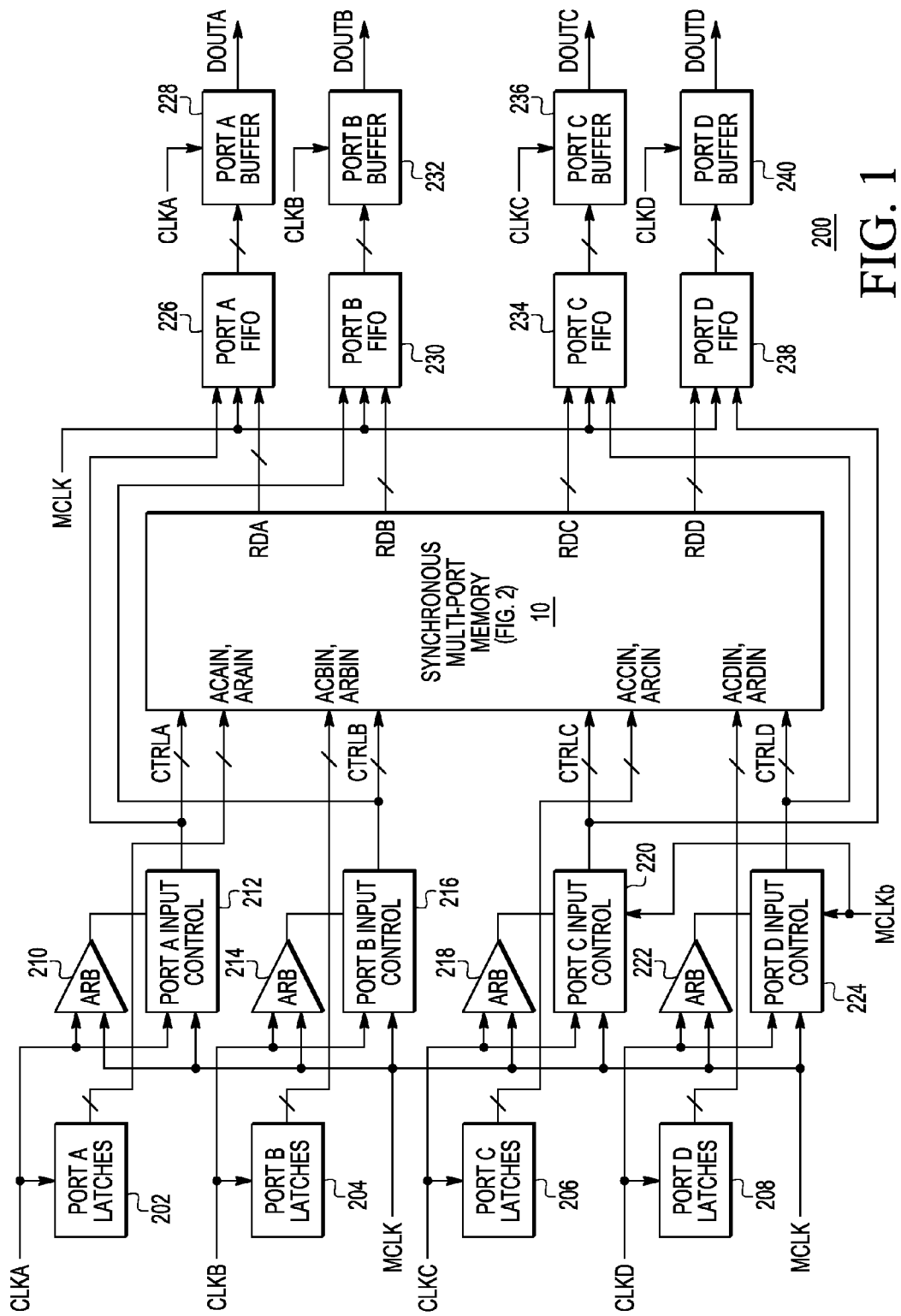
FIG. 1 is a block diagram of a memory system having a multi-port memory and synchronization circuitry, in accordance with an embodiment of the disclosure.

In one aspect, a multiple-port memory (i.e. multi-port memory) supports simultaneous read and write access with no wait states. In one embodiment, the multi-port memory includes a memory array of bit cells which is independently addressable by first circuitry, which may be referred to as X-circuitry, and second circuitry, which may be referred to as Y-circuitry. The X-circuitry may include corresponding word lines and bit line pairs coupled to the array of bit cells, along with corresponding access and control circuitry, and the Y-circuitry may includes corresponding word lines and bit line pairs coupled to the array of bit cells, along with corresponding access and control circuitry. In this manner, each bit cell of the array can either be accessed by the X-circuitry or the Y-circuitry. The X-circuitry and Y-circuitry operate in accordance with the memory clock (MCLK and its complement MCLKb), and can each process an access request within one clock cycle of MCLK. Therefore, the multi-port memory is capable of providing an output by its X-circuitry and Y-circuitry on every cycle of MCLK. For example, in case of a read access processed by the X-circuitry, read data can be provided by the multi-port memory within one clock cycle of MCLK.

In one aspect, when a bit cell is selected to be processed by both the X-circuitry and the Y-circuitry, a bit line pair of the Y-circuitry is kept decoupled from the storage nodes of the selected memory cell and from its data line pair whereas the bit line pair of the X-circuitry only is coupled to the storage nodes of the selected memory cell and to its corresponding data line pair and to the data line pair. Also the selected word line of the Y-circuitry is kept disabled whereas the selected word line of the X-circuitry is enabled. Thus, the capacitance of the bit line pair of the Y-circuitry is kept from adversely impacting the access to the selected bit cell whereas the bit line pair of the X-circuitry provides the needed access.

In one embodiment, the X-circuitry and Y-circuitry of the multi-port memory is capable of processing accesses received at any of 4 ports: port A, port B, port C, and port D. Each of the ports A, B, C, and D can interface with logic circuitry operating in accordance with a corresponding port clock, such as CLKA, CLKB, CLKC, and CLKD, respectively. Therefore, each of ports A, B, C, and D receive access requests in accordance with its corresponding port clock, but the access requests are processed by the multi-port memory in accordance with MCLK. Note that each of CLKA, CLKB, CLKC, CLKD, and MCLK may be asynchronous to each other in phase and/or frequency, but MCLK is at least as fast as each of CLKA, CLKB, CLKC, and CLKD. In one embodiment, the X-circuitry of the multi-port memory is used to process accesses from ports A and C and can provide read data at outputs RDA and RDC, respectively, and the Y-circuitry of the multi-port memory is used to process accesses received on ports B and D and can provide read data at outputs RDB and RDD, respectively. In one embodiment, access requests on ports A and B are launched for processing by the X-circuitry and the Y-circuitry, respectively, during a first phase of a clock cycle of MCLK (e.g. at the rising edge of the clock cycle) and access requests on ports C and D are launched for processing by the X-circuitry and the Y-circuitry, respectively, during the second phase of the clock cycle of MCLK (e.g. at the falling edge of the clock cycle). In the case of read access requests, the read data for accesses launched during an MCLK cycle would be available at each of RDA, RDB, RDC, and RDD by the end of the MCLK cycle, regardless of whether the access was launched during the first or second phase of the MCLK. The output read data is then synchronized with the corresponding port clock. In this manner, a memory system which incorporates this multi-port memory is capable of processing an access request received at any port within 2 clock cycles of the corresponding port clock (that is, with a two cycle latency of the port clock), as will be described in more detail below.

FIG. 1 illustrates, in partial block diagram, a memory system 200 in accordance with an embodiment of the disclosure. Memory system 200 includes a synchronous multi-port memory 10 and synchronization circuitry coupled to memory 10. Memory 10 includes a port A column address input (AGAIN), a port A row address input (ARAIN), a port B column address input (ACBIN), a port B row address input (ARBIN), a port C column address input (ACCIN), a port C row address input (ARCIN), a port D column address input (ACDIN), and a port D row address input (ARDIN), a port A read data output (RDA), a port B read data output (RDB), a port C read data output (RDC), and a port D read data output (RDD). When an address for a qualified access is received at either ACAIN/ARAIN or ACCIN/ARCIN, then the X-circuitry processes the access within a clock cycle of MCLK, and when an address for a qualified access is received at either ACBIN/ARBIN or ACDIN/ARDIN, then the Y-circuitry processes the access within a clock cycle of MCLK, as will be described in further detail with respect to subsequent figures.

The synchronization circuitry coupled to memory 10 includes port A latches 202, port B latches 204, port C latches 206, and port D latches 208, arbitrator (ARB) 210, port A input control 212, ARB 214, port B input control 216, ARB 218, port C input control 220, ARB 222, and port D input control 224, port A first-in first-out storage circuitry (FIFO) 226, port A buffer 228, port B FIFO 230, port B buffer 232, port C FIFO 234, port C buffer 236, port D FIFO 238, and port D buffer 240. CLKA is provided to port A latches 202, ARB 210, port A input control 212, and port A buffer 228. CLKB is provided to port B latches 204, ARB 214, port B input control 216, and port B buffer 232. CLKC is provided to port C latches 206, ARB 218, port C input control 220, and port C buffer 236. CLKD is provided to port D latches 208, ARB 222, port D input control 224, and port D buffer 240. Port A latches 202 is coupled to provide AGAIN, ARAIN to memory 10, port B latches 204 is coupled to provide ACBIN, ARBIN to memory 10, port C latches 206 is coupled to provide ACCIN, ARCIN to memory 10, and port D latches 208 is coupled to provide ACDIN, ARDIN to memory 10. MCLK is provided to ARB 210, port A input control 212, ARB 214, port B input control 216, ARB 218, port C input control 220, ARB 222, port D input control 224, port A FIFO 226, port B FIFO 230, port C FIFO 234, and port D FIFO 238. The inverse of MCLK, MCLKb, is provided to port C input control 220 and port D input control 224. Port A input control 212 provides control signals, CTRLA, to memory 10 and port A FIFO 226. Port B input control 216 provides control signals, CTRLB, to memory 10 and port B FIFO 230. Port C input control 220 provides control signals, CTRLC, to memory 10 and port C FIFO 234. Port D input control 224 provides control signals, CTRLD, to memory 10 and port D FIFO 238. An output of ARB 210 is coupled to port A input control 212, an output of ARB 214 is coupled to port B input control 216, an output of ARB 218 is coupled to port C input control 220, and an output of ARB 222 is coupled to port D input control 224. Port A FIFO 226 has an input coupled to receive RDA from memory 10 and an output coupled to port A buffer 228. Port A buffer 228 provides a data output of port A, DOUTA, of system 200. Port B FIFO 230 has an input coupled to receive RDB from memory 10 and an output coupled to port B buffer 232. Port B buffer 232 provides a data output of port B, DOUTB, of system 200. Port C FIFO 234 has an input coupled to receive RDC from memory 10 and an output coupled to port C buffer 236 and an output coupled to port C buffer 236. Port C buffer 236 provides a data output of port C, DOUTC, of system 200. Port D FIFO 238 has an input coupled to receive RDD from memory 10 and an output coupled to port D buffer 240. Port D buffer 240 provides a data output of port D, DOUTD, of system 200.

In operation, memory system 200 is capable of processing an access request received at port A, B, C, or D within 2 clock cycles of the corresponding port clock. For example, for a read request provided to port A latches 202, read data is provided as DOUTA within 2 clock cycles of CLKA. Note that since MCLK is at least as fast as each of CLKA, CLKB, CLKC, and CLKD, within 2 cycles of any of these clocks, it is guaranteed that memory 10 will have time to process the access request (which, as will be described below in more detail, is completed by memory 10 within one clock cycle of MCLK). The port latches may each include one or more registers which latches, synchronized with the corresponding port clock, address information corresponding to an access request. Furthermore, if the access request is a write access request, the port latches will also latch write data. Note also that, although not explicitly illustrated in FIG. 1, each of the port latches may also provide any number of control signals for each access request, such as a read/write (R/W) signal, to provide additional information about the current access request. The address information latched in each port latch can be provided to the corresponding row and column address inputs of memory 10 in accordance with corresponding port control signals provided by the corresponding port input control. Each of the port control signals, such as CTRLA, CTRLB, CTRLC, and CTRLD includes a qualified cycle signal (QC) and a launch signal. The QC signal of each port indicates whether there is a valid access request (as opposed to a no-operation, NOP) waiting to be processed by memory 10 in the corresponding port latches, and the launch signal of the port determines when the qualified access is to by accepted and processed by memory 10. In the cases of ports A and B, the launch signals are asserted upon rising edges of MCLK, and in the cases of ports C and D, the launch signals are asserted upon falling edges of MCLK. The port input control of each port determines when an access is qualified (and asserts QC in response thereto), and appropriately asserts the corresponding launch signal.

For example, referring to port A as an example, port A input control 212 asserts QC for a valid access present in port A latches 202 in response to a rising edge of MCLK unless an immediately preceding rising edge of MCLK has occurred more recently than a most receive occurrence of a rising edge of CLKA. That is, an access is qualified (and thus QC asserted) in response to a current rising edge of MCLK if the immediately preceding rising edge of CLKA is after the immediately preceding rising edge of MCLK, but is not asserted if the immediately preceding rising edge of CLKA is prior to the immediately preceding rising edge of MCLK. In this case, in which QC is not asserted, a NOP situation is indicated. For ports A and B, upon the corresponding QC being asserted, the corresponding launch signal is also asserted with the same rising edge of MCLK, since qualified accesses on ports A and B are launched during the first phase of MCLK. For ports C and D, upon the corresponding QC being asserted, the corresponding launch signal is asserted at the subsequent falling edge of MCLK, since qualified accesses on ports C and D are launched during the second phase of the same clock cycle of MCLK.

Coupled to each of the port input controls is an arbiter. Each arbiter compares the corresponding port clock with MCLK, such that, upon a rising edge of MCLK, the arbiter determines whether a most recent rising edge of the port clock occurred more recently than the most recent rising edge of MCLK and provides its output to the corresponding input control. The input control, based on the determination made by the corresponding arbiter, provides control signals QC and launch to memory 10. In response to each rising edge of MCLK, QC is asserted by the corresponding port input control only if a most recent rising edge of the port clock occurred more recently that the rising edge of MCLK within the previous cycle of MCLK. For example, with respect to port A, ARB 210 compares CLKA with MCLK such that, upon a rising edge of MCLK, ARB 210 determines whether a most recent rising edge of CLKA occurred more recently than the most recent rising edge of MLCK and provides its output to port A input control 212. Port A input control 212, based on the determination by ARB 210, provides QC and launch to memory 10. In response to each rising edge of MCLK, QC of CTRLA is asserted by port A input control 212 only if a most recent rising edge of CLKA occurred more recently than the rising edge of MCLK within the previous cycle of MCLK. Upon the rising edge of MCLK, if port A input control 212 asserts QC, port A input control 212 also asserts launch. Note that the same operation applies to ports B, C, and D, except that for ports C and D, if the port input control asserts the corresponding QC, the corresponding launch is asserted at the subsequent falling edge of MCLK. Therefore, MCLKb is provided to port C input control 220 and port D input control 224 (in which rising edges of MCLKb may be used to assert the launch signals for ports C and D). Note that the arbitration for ports C and D is based on the rising edge of MCLK even though the launch will occur for ports C and D on the rising edge of MCLKb.

Once an access on a port is launched by the corresponding launch signal, memory 10 processes the access within one clock cycle of MCLK. In the case of a read access, read data will be available at RDA, RDB, RDC, and RDD at the next rising edge of MCLK. This is the case regardless of whether or not the access was launched during the first phase or the second phase of the MCLK cycle. The frequency of MCLK provides enough time such that the access can be completed within a phase of the clock. Port FIFOs 226, 230, 234, and 238 are coupled to memory 10 outputs RDA, RDB, RDC, RDD, respectively. Port A FIFO 220 is controlled by CTRLA and MCLK, port B FIFO 230 is controlled by CTRLB and MCLK, port C FIFO 234 is controlled by CTRLC and MCLK, and port D FIFO 238 is controlled by CTRLD and MCLK. Note that each FIFO may include control circuitry which controls when an input (the data at RDA, RDB, RDC, or RDD) is pushed into the corresponding FIFO, and when an output is popped from a FIFO into a corresponding buffer (buffer 228, 232, 236, or 240). In the illustrated embodiment, each FIFO is a two stage FIFO capable of storing two data elements. A push places a data element into the FIFO, and a pop removes the data element of the two data elements that was first pushed into the FIFO. As will be described in more detail below, in response to read accesses, read data is provided as RDA, RDB, RDC, or RDD. The read data at an output of a corresponding port is pushed into the FIFO of the corresponding port synchronized to MCLK while the read data already in the FIFO is popped to the corresponding buffer synchronized to the port clock. The corresponding buffer clocks out the read data on the second port clock after the port clock latched the inputs to the corresponding port input latch 202, 204, 206, or 208. For example, the read data at RDA is pushed into port A FIFO 226 synchronized to MCLK while the read data in port A FIFO 226 is popped from port A FIFO 226 to port A buffer 228 synchronized to CLKA. Similar operation applies to ports B, C, and D, as well. Note that in the illustrated embodiment, a two stage FIFO is sufficient since only one read access can be processed in a single port cycle. That is, only one FIFO stage per port clock cycle is required because only the first MCLK cycle beginning on the rising edge of MCLK will access memory 10 within a port clock cycle beginning with the rising edge of the port clock with any additional cycles of MLCK within the port clock cycles resulting in NOPs to memory 10. Note that no data is pushed into a FIFO by a NOP cycle, so no change in the FIFO data occurs. Even if the MCLK and a port clock are the same frequency, no more than two clock cycles of the port clock is needed to ensure completion of one MCLK cycle. Therefore, the read data corresponding to each of two port clock cycles needs to be held in the FIFO during any given two port clock cycles. For example, with a read access request received at port A latches 202 with respect to a rising edge of CLKA, read data will be output as DOUTA from port A buffer 228 2 clock cycles of CLKA later regardless of the frequencies of MCLK and CLKA (so long as the frequency of CLKA does not exceed the frequency of MCLK).

Figure 2:
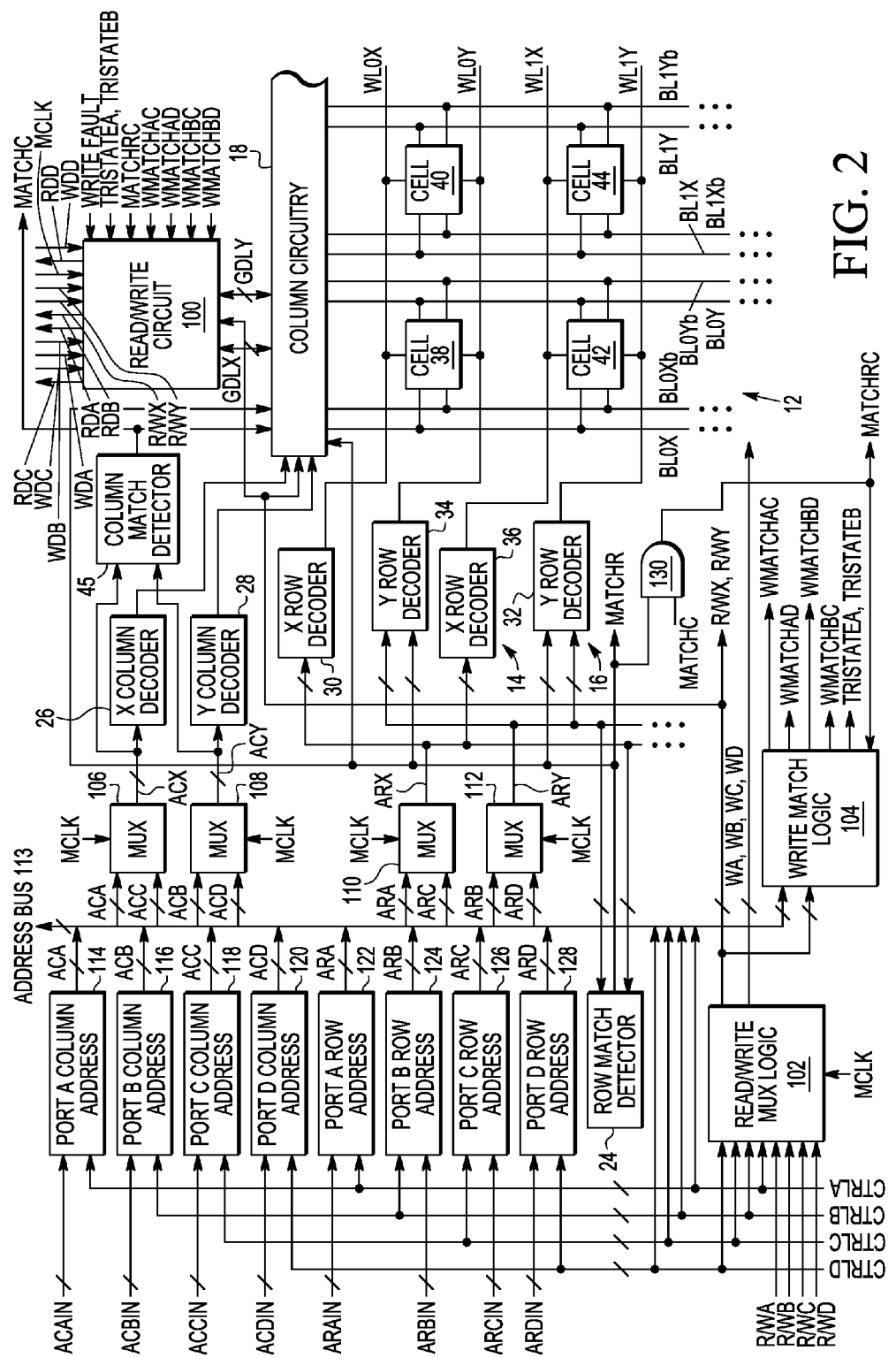
FIG. 2 is a block diagram of the multi-port memory of FIG. 1, in accordance with an embodiment of the disclosure.

FIG. 2 illustrates, in block diagram form, a more detailed view of memory 10 of FIG. 1. Memory 10 includes an array 12, X-circuitry row decoder 14, Y-circuitry row decoder 16, column circuitry 18, X column address decoder 26, Y column address decoder 28, column match detector 45, read/write (R/W) circuit 100, multiplexers (MUXes) 106, 108, 110, and 112, row match detector 24, R/W MUX logic 102, write match logic 104, port A column address buffer 114, port B column address buffer 116, port C column address buffer 118, port D column address buffer 120, port A row address buffer 122, port B row address buffer 124, port C row address buffer 126, and port D row address buffer 128, AND gate 130, and address bus 113. X-circuitry row decoder 14 includes an X row decoder 30 and an X row decoder 36. Y-circuitry row decoder 16 includes a Y row decoder 34 and a Y row decoder 32. Array 12 includes bit cells 38, 40, 42, and 44. In one embodiment, array 12 is a static random access memory (SRAM) array.

Port A column address buffer 114 receives column address bus AGAIN and CTRLA (from port A latches 202 and port A input control 212, respectively), and provides the port A column address as ACA to address bus 113. Port B column address buffer 116 receives column address bus ACBIN and CTRLB (from port B latches 204 and port B input control 216, respectively), and provides the port B column address as ACB to address bus 113. Port C column address buffer 118 receives column address bus ACCIN and CTRLC (from port C latches 206 and port C input control 220, respectively), and provides the port C column address as ACC to address bus 113. Port D column address buffer 120 receives column address bus ACDIN and CTRLD (from port D latches 208 and port D input control 224, respectively), and provides the port D column address as ACD to address bus 113. Port A row address buffer 122 receives row address bus ARAIN and CTRLA (from port A latches 202 and from port A input control 212, respectively), and provides the port A row address as ARA to address bus 113. Port B row address buffer 124 receives row address bus ARBIN and CTRLB (from port B latches 204 and from port B input control 216, respectively), and provides the port B row address as ARB to address bus 113. Port C row address buffer 126 receives row address bus ARCIN and CTRLC (from port C latches 206 and from port C input control 220, respectively), and provides the port C row address as ARC to address bus 113. Port D row address buffer 128 receives row address bus ARDIN and CTRLD (from port D latches 208 and from port D input control 224, respectively), and provides the port D row address as ARD to address bus 113. In one embodiment, each of the address buses ACA, ACB, ACC, ACD, ARA, ARB, ARC and ARD is provided to address bus 113 based on the launch signal of the corresponding port control signals (CTRLA, CTRLB, CTRLC, and CTRLD) which may be used to control the outputs of each of the port column address buffers and port row address buffers to address bus 113. Also, in the illustrated embodiment, each of CTRLA, CTRLB, CTRLC, and CTRLD are also provided to address bus 113.

Address bus 113 is coupled to MUXes 106, 108, 110, and 112. MUX 106 receives MCLK at a control input and receives column address bus ACA at a first data input and column address bus ACC at a second data input, and provides the selected one of ACA and ACC as ACX to X column address decoder 26. Therefore, ACX corresponds to the column address of either port A or port C, whichever is currently selected, based on the phase of MCLK, to be processed by the X-circuitry of memory 10. MUX 108 receives MCLK at a control input and receives column address bus ACB at a first data input and column address bus ACD at a second data input, and provides the selected one of ACB and ACD as ACY to Y column address decoder 28. Therefore, ACY corresponds to the column address of either port B or port D, whichever is currently selected, based on the phase of MCLK, to be processed by the Y-circuitry of memory 10. MUX 110 receives MCLK at a control input and receives row address bus ARA at a first data input and row address bus ARC at a second data input, and provides the selected one of ARA and ARC as ARX to X row decoders 30 and 32. Therefore, ARX corresponds to the row address of either port A or port C, whichever is currently selected, based on the phase of MCLK, to be processed by the X-circuitry of memory 10. MUX 112 receives MCLK at a control input and receives ARB at a first data input and ARD at a second data input, and provides the selected one of ARB and ARD as ARY to Y row decoders 34 and 36. Therefore, ARY corresponds to the row address of either port B or port D, whichever is currently selected, based on the phase of MCLK, to be processed by the Y-circuitry of memory 10. Therefore, when MCLK is a logic level one (corresponding to the first phase of an MCLK cycle, ports A and B are selected to be processed by the X-circuitry and Y-circuitry, respectively. In this case, ACA is provided as ACX and ARA as ARX, and ACB is provided as ACY and ARB as ARY. When MCLK is a logic level zero (corresponding to the second phase of the MCLK cycle, ports C and D are selected to be processed by the X-circuitry and Y-circuitry, respectively. In this case, ACC is provided as ACX and ARC as ARX, and ACD is provided as ACY and ARD as ARY.

Row match detector 24 receives ARX and ARY and determines whether a match in the currently accessed row addresses exists, and asserts row match indicator (MATCHR) if there is a match. MATCHR is provided to AND gate 130, column circuitry 18, and Y row decoders 34 and 36. Note that row match detector 24 may also output the complement of MATCHR, which may be denoted as MATCHRb. Column match detector 45 receives ACX and ACY from multiplexers 106 and 108, respectively, and determines whether a match in the currently accessed column addresses exists, and asserts a column match indicator (MATCHC) if there is a match. Note that column match detector 45 may also output the complement of MATCHC, which may be denoted as MATCHCb. MATCHC is provided to column circuitry 18 and AND gate 130. AND gate 130 receives MATCHR at a first input and MATCHC at a second input and provides a row and column match indicator (MATCHRC) if both the currently accessed row addresses match and the currently accessed column addresses match. MATCHRC is provided to write match logic 104, to write fault detector 600 (not shown in FIG. 2), and to read/write circuit 100. Each of CTRLA, CTRLB, CTRLC, and CTRLD are also provided to address bus 113 which is also coupled to write match logic 104. Write match logic 104 provides write match signals (WMATCHAC, WMATCHAD, WMATCHBD, and WMATCHBC) and tristate enable signals (TRISTATEA and TRISTATE B). Read/write MUX logic 102 is coupled to receive each of CTRLA, CTRLB, CTRLC, and CTRLD, and also receives a R/W signal from each port (R/WA, R/WB, R/WC, and R/WD) which may be received from the corresponding port latches. Read/write MUX logic provides write signals WA, WB, WC, and WD, and R/W signals R/WX and R/WY which indicate whether each of the X-circuitry and the Y-circuitry is performing a read or a write. (As used herein for R/W signals, when the R/W is a logic level low or zero, a write is being performed and when the R/W is a logic level high or one, a read is being performed.)

R/W circuit 100 is bidirectionally coupled to column circuitry by way of the X-circuitry global data line bus (GDLX) and the Y-circuitry global data line bus (GDLY). R/W circuit 100 also receives MCLK, R/WX, R/WY, a WRITE FAULT signal, TRISTATEA, TRISTATEB, MATCHRC, WMATCHAC, WMATCHAD, WMATCHBC, and WMATCHBD. R/W circuit 100 also provides the read data RDA, RDB, RDC, and RDD for read accesses, and receives write data WDA, WDB, WDC, WDD for write accesses. Note that the write data may be received from the port latches of the corresponding port.

Array 12 includes an array of bit cells, such as cells 38, 40, 42, and 44. Each bit cell is coupled to two word lines (one word line belonging to the X-circuitry and one word line to belonging to the Y-circuitry) and to two pairs of bitlines (one pair belonging to the X-circuitry and one pair belonging to the Y-circuitry). In the illustrated embodiment of FIG. 2, X row decoder 30 selectively drives X-circuitry word line 0 (WL0X) and X row decoder 36 selectively drives X-circuitry word line 1 (WL1X), based on ARX. Y row decoder 34 selectively drives Y-circuitry word line 0 (WL0Y) and Y row decoder 36 selectively drives Y-circuitry work line 1 (WL1Y), based on ARY. The access nodes of bit cells 38 and 42 are coupled to bit line pair BL0X/BL0Xb of the X-circuitry and bit line pair BL0Y/BL0Yb of the Y-circuitry. The access nodes of bit cells 40 and 44 are coupled to bit line pair BL1X/BL1Xb of the X-circuitry and bit line pair BL1Y/BL1Yb of the Y-circuitry. (Note that each bit line pair includes a true bit line, e.g. BL0X, BL1X, BL0Y, BL1Y, and a complementary bit line, e.g. BL0Xb, BL1Xb, BL0Yb, BL1Yb.) The enable inputs of bit cells 38 and 40 are coupled to WL0X and WL0Y, and the enable inputs bit cells 42 and 44 are coupled to WL1X and WL1Y. The bit cells are stable when accessed by their X word line or their Y word line, but are not stable when accessed by both the X word line and the Y word line. Row match detector 24 controls Y row decoders 16 to assure that this condition for bit cell stability is met. Array 12 includes more than the illustrated 4 bit cells and accordingly more bit line pairs and word lines that shown. Also, memory 10 may also include precharge circuits (not shown) coupled to each of the bit lines of array 12.

Figure 10:
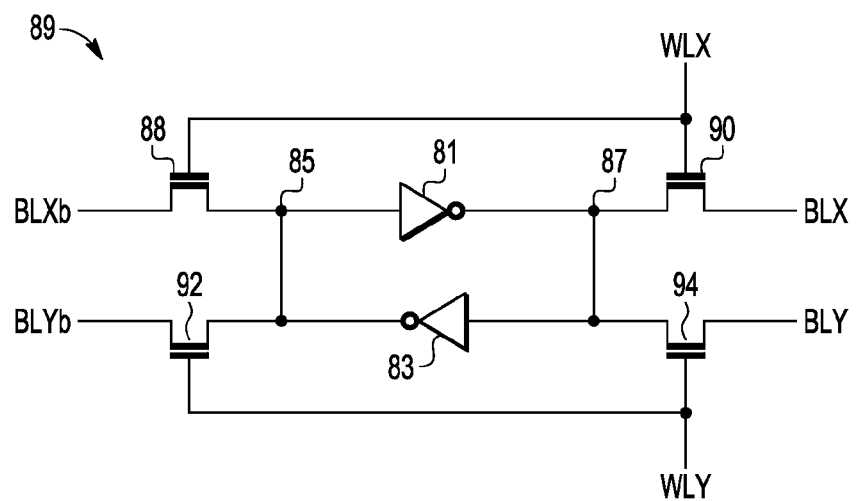
FIG. 10 is a circuit diagram of a memory cell of the multi-port memory of FIG. 2, in accordance with an embodiment of the disclosure.

Shown in FIG. 10 is a circuit diagram of an exemplary memory cell 89 which is exemplary for the other bit cells of array 12 such as memory cells 38, 40, 42, and 44. Bit cell 89, which is a static random access memory (SRAM) cell, comprises inverters 81 and 83 connected to nodes 85 and 87 and transistors 88, 90, 92, and 94 which are N channel transistors in this example. Inverter 81 has an input connected to node 85 and an output connected to node 87. Inverter 83 has an input connected to node 87 and an output connected node 85. Nodes 85 and 87 are storage nodes of memory cell 89. Transistor 88 has a first current electrode connected to node 85, a control electrode connected to word line WLX which is an X-circuitry word line, and a second current electrode connected to bit line BLXb which is a complementary bit line of the X-circuitry. Transistor 90 has a first current electrode connected to node 87, a control electrode connected to word line WLX, and a second current electrode connected to bit line BLX which is a true bit line of the X-circuitry. Transistor 92 has a first current electrode connected to node 85, a control electrode connected to a word line WLY, which is a word line of the Y-circuitry, and a second current electrode connected to complementary bit line BLYb of the Y-circuitry. Transistor 94 has a first current electrode connected to node 87, a control electrode connected to word line WLY, and true bit line BLY of the Y-circuitry. Nodes 85 and 87 are storage nodes that are accessed through transistors 88 and 92 for node 85 and transistors 90 and 94 for node 87. Inverters 81 and 83 together may be considered a storage latch. Transistors 90 and 88 are enabled when memory cell 89 is selected by the X-circuitry for coupling the storage nodes to the X-circuitry bit line pair. Transistors 92 and 94 are enabled when memory cell 89 is selected by the Y-circuitry. If memory cell 89 is selected by both the X and Y circuitries, transistors 88 and 90 are enabled and transistors 92 and 94 are kept disabled by deselecting word line WLY so that bit lines BLYb and BLY are kept isolated from storage nodes 85 and 87. In this example the bit lines are used for either writing to storage nodes 85 and 87 or reading from storage nodes 85 and 87. The word lines are for enabling the coupling between storage nodes and bit lines. The control electrodes of transistors 88, 90, 92, and 94 may be considered enable inputs and the second current electrodes may be considered access nodes.

Referring back to FIG. 2, note that ARX (which is provided by either port A row address buffer 122 or port C row address buffer 126) provide true and complementary signals of row address signals for the X-circuitry. Similarly, ARY (which his provided by either port B address buffer 124 or port D row address buffer 128) provide true and complementary signals of row address signals for the Y-circuitry. Row decoders 30 and 32 are coupled to the combination of true and complementary address signals for the X-circuitry. When row decoders 30 and 32 output a logic high, they select word line WL0X and WL1X, respectively. Row decoders 34 and 36 are coupled to the combination of true and complementary address signals for the Y-circuitry. When row decoders 34 and 35 are a logic high, they select word line WL0Y and WL1Y, respectively.

As described above, row match detector 24 detects when the same row address is being accessed by both the X-circuitry and Y-circuitry and asserts MATCHR. When row address for the X-circuitry and the Y-circuitry are the same, that means that the selected word lines for the X-circuitry and the Y-circuitry would be the same row. When the row addresses match, the MATCHR signal inhibits row decoders 32 and 34 resulting in word lines WL0Y and WL1Y being inactive. Consequently, only X-circuitry bit line pairs (BL0X, BL0Xb, or BL1X, BL1Xb) may be selected by the memory cells on WL0X or alternatively the memory cells on WL1X. In contrast, in normal operation with no row address match, one of word lines WL0X, WL1X and one of word lines WL0Y, WL1Y are both selected. As a result, the bit lines in both the X-circuitry and Y-circuitry coupled to the selected bit cells of the corresponding X or Y circuitry are activated by the memory cells coupled to the active word lines. That is, in normal operation, both the X-circuitry and Y-circuitry are active in array 12 so that a word line and bit lines are activated for both the X and Y circuitries. In normal operation, with no row match, the X-circuitry and Y-circuitry can independently and simultaneously access the selected memory cells.

Column circuitry 18 is coupled to bit lines BL0X, BL0Xb, BL0Y, BL0Yb, BL1X, BL1Xb, BL1Y, and BL1Yb, selects among these bit lines, senses data at the selected bit lines, and couples the sensed data to global data lines GDLX for the X-circuitry and GDLY for the Y-circuitry in response to column addresses provided by X column address buffer 26 and Y column address buffer 28. True and complementary bit lines of the same port connected to the same column of cells may be referenced as a bit line pair. For example, bit lines BL0X and BL0Xb form a bit line pair. Similarly, data lines DLX and DLXb shown in FIG. 3 may be referenced as a data line pair.

Figure 3:
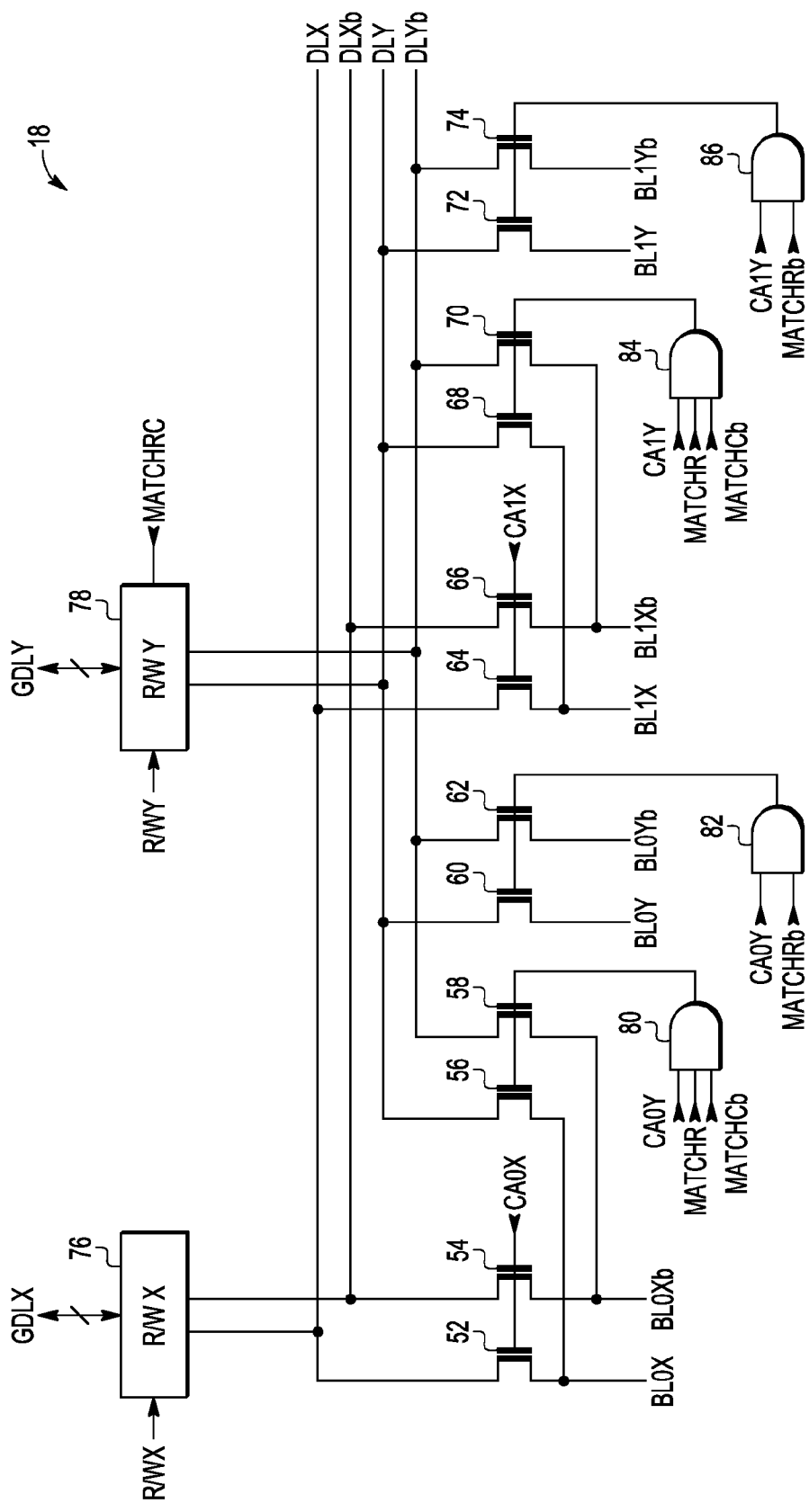
FIG. 3 is a combination circuit, logic, and block diagram of a portion of the multi-port memory of FIG. 2, in accordance with an embodiment of the disclosure.

Shown in FIG. 3 is column circuitry 18 in more detail. Column circuitry 18 includes transistors 52, 54, 56, 58, 60, 62, 64, 66, 68, 70, 72, and 74, a read/write (R/W) X buffer 76 for the X-circuitry, a R/W Y buffer 78 for the Y-circuitry, AND gates 80, 82, 84, and 86. Column circuitry 18 less the R/W X buffer 76 and R/W Y buffer 78 may be referenced as switching logic. Signals CA0X, CA0Y, CA1X, and CA1Y result from decoding the X-circuitry column address (ACX) for signals CA0X and CA1X and result from decoding the Y-circuitry column address (ACY) for signals CA0Y and CA1Y and may referenced as a column address signal or a column decode signal. Transistor 52 has a first current electrode connected to bit line BL0X, a control electrode for receiving a column address signal CA0X, and a second current electrode coupled to a true data line DLX that is coupled to R/W X buffer 76. Transistor 54 has a first current electrode connected to bit line BL0Xb, a control electrode for receiving column address signal CA0X, and a second current electrode connected to a complementary data line DLXb that is coupled to R/W X buffer 76. Thus, when the column address CA0X is asserted, transistors 52 and 54 become conductive so that bit lines BL0X and BL0Xb are coupled to data lines DLX and DLXb. Transistor 60 has a first current electrode connected to bit line BL0Y, a control electrode connected to an output of AND gate 82, and a second current electrode coupled to a true data line DLY that is coupled to R/W Y buffer 78. Transistor 62 has a first current electrode connected to bit line BL0Yb, a control electrode connected to the output of AND gate 82, and a second current electrode coupled to a complementary data line DLYb that is connected to R/W Y buffer 78. Thus when there is not a row match (MATCHRb=1) and the column address CA0Y is asserted, transistors 60 and 62 become conductive so that bit lines BL0Y and BL0Yb are coupled to data lines DLY and DLYb, respectively, through transistors 60 and 62, respectively.

Transistor 64 has a first current electrode connected to bit line BL1X, a control electrode for receiving a column address CA1X, and a second current electrode coupled to true data line DLX that is coupled to R/W X buffer 76. Transistor 66 has a first current electrode connected to bit line BL1Xb, a control electrode for receiving column address CA1X, and a second current electrode connected to complementary data line DLXb that is coupled to R/W X buffer 76. Thus, when the column address CA1X is asserted, transistors 52 and 54 become conductive so that bit lines BL1X and BL1Xb are coupled to data lines DLX and DLXb. Transistor 72 has a first current electrode connected to bit line BL1Y, a control electrode connected to an output of AND gate 86, and a second current electrode coupled to true data line DLY that is connected to R/W Y buffer 78. Transistor 74 has a first current electrode coupled to BL1Yb, a control gate coupled to the output of NAND gate 86, and a second current electrode coupled to data line DLYb. AND gate 86 has a first input for receiving a column address CA1Y and a second input for receiving MATCHRb. As previously described for MATCHRb, when a match has not been detected, MATCHRb is a logic high so that column address signal CA1Y is passed to the control gate of transistors 72 and 74. Thus, when column address CA1Y is asserted transistors 72 and 74 become conductive so that bit lines BL1Y and BL1Yb are coupled to data lines DLY and DLYb, respectively, through transistors 72 and 74, respectively.

Therefore, note that when there is no row match, the X-circuitry bit line pair that is selected by the decoded X-circuitry column address is coupled to DLX/DLXb, and the Y-circuitry bit line pair that is selected by the decoded Y-circuitry column address is coupled to DLY/DLYb. Also, note that for each column address, only one decoded column address bit will be asserted. That is, for decoded ACX, only one of CA0X or CA1X will be asserted. Similarly, for decoded ACY, only one of CA0Y or CA1Y will be asserted.

Transistor 56 has a first current electrode connected to bit line BL0X, a control electrode connected to the output of AND gate 80, and a second current electrode coupled to data line DLY that is connected to R/W Y buffer 78. Transistor 58 has a first current electrode connected to complementary bit line BL0Xb, a control electrode connected to the output of AND gate 80, and a second current electrode coupled to complementary data line DLYb that is connected to R/W Y buffer 78. AND gate 80 has a first input for receiving column address signal CA0Y, MATCHR, and MATCHCb. When the column addresses for the X-circuitry and Y-circuitry match, MATCHCb is a logic low, thus when there is a column address match, AND gate 80 is forced to provide a logic low output which causes transistors 56 and 58 to be non-conductive. When the row addresses for the X-circuitry and Y-circuitry do not match, MATCHR is a logic low which also forces AND gate 80 to provide a logic low. Thus, when the row addresses do not match, the output of AND gate 80 is a logic low and transistors 56 and 58 are non-conductive. On the other hand when there is no column match but there is a row match, MATCHR and MATCHCb are both a logic high, so that the output of AND gate 80 follows column address signal CA0Y. Thus for the case where there is a row match but not a column match the access for Y-circuitry is performed using the bit line pair of the X-circuitry that is selected by the Y-circuitry column address. That is, in the case of a row match but not a column match, the bit lines of the X-circuitry are shared by both the X-circuitry and the Y-circuitry. For example, if CA0Y is asserted, transistors 56 and 58 are conductive and couple the pair of X-circuitry bit lines BL0X and BL0Xb to the Y-circuitry data lines DLY and DLYb.

Transistor 68 has a first current electrode connected to bit line BL1X, a control electrode connected to the output of AND gate 84, and a second current electrode coupled to data line DLY that is connected to R/W Y buffer 78. Transistor 70 has a first current electrode connected to complementary bit line BL1Xb, a control electrode connected to the output of AND gate 84, and a second current electrode coupled to complementary data line DLYb that is connected to R/W Y buffer 78. AND gate 84 has a first input for receiving column address signal CA1Y, MATCHR, and MATCHCb. Similarly as for AND gate 80, when the column addresses for the X-circuitry and Y-circuitry match, MATCHCb is a logic low thus when there is a column address match, AND gate 84 is forced to provide a logic low output which causes transistors 68 and 70 to be non-conductive. When the row addresses for the X-circuitry and Y-circuitry do not match, MATCHR is a logic low which also forces AND gate 84 to provide a logic low. Thus, when the row addresses do not match, the output of AND gate 80 is a logic low and transistors 68 and 70 are non-conductive. On the other hand, when there is no column match but there is a row match, MATCHR and MATCHCb are both a logic high so that the output of AND gate 84 follows column address signal CA1Y. Thus for the case where there is a row match but not a column match, the access for the Y-circuitry is performed using the bit line pair of the X-circuitry that is selected by the Y-circuitry column address. For example, in the case of a row match but no column match, if CA1Y is asserted transistors 68 and 70 are conductive and couple the pair of X-circuitry bit lines BL1X and BL1Xb to the Y-circuitry data lines DLY and DLYb.

Note that when there is row match but not a column match, the Y-circuitry data line pair DLY, DLY0 is coupled to a different X-circuitry bit line pair than the X-circuitry bit line pair coupled to the X-circuitry data line pair DLX, DLXb. Consequently each addressed bit line pair of the X-circuitry is coupled to only one data line pair, either DLX/DLXb or DLY/DLYb. As stated before, all of the bit lines of the Y-circuitry are disconnected from the Y-circuitry data lines under row address match conditions.

For a read in the case where the row addresses for the X-circuitry and the Y-circuitry are different, data present on the bit lines is selectively coupled to data line pair DLX and DLXb and data line pair DLY and DLYb from X-circuitry bit lines and Y-circuitry bit lines, respectively. The selection is made by column address signals CA0X and CA1X for the X-circuitry and column address signals CA0Y and CA1Y for the Y-circuitry. The row decoder selected by the X-circuitry row address enables its word line, and the row decoder selected by the Y-circuitry row address enables its word line. MATCHR is not asserted because the row addresses for the X-circuitry and Y-circuitry are different so none of the row decoders are disabled due to MATCHR. As stated previously, more memory cells than those shown are present and similarly there are more bit line pairs and word lines and thus more corresponding selection signals for column selection and row selection. The description is focused on the selection and non-selection relating to the shown signals such as CA0X, CA1X, CA0Y, and CA1Y for column selection and WL0X, WL1X, WL0Y, and WL1Y for row selection. R/W X buffer 76 and R/W Y buffer 78 each include a sensing circuit and a write driver. For a read, R/W X buffer 76 and R/W Y buffer 78 sense the data present on data line pair DLX and DLXb and data line pair DLY and DLYb, respectively. After sensing, the data is provided on global data lines GDLX and GDLY. For writing in which the row addresses are different, data is received on global data lines GDLX and GDLY. The data is then written by R/W X buffer 76 and R/W Y buffer 78 onto data line pair DLX and DLXb and data line pair DLY and DLYb, respectively. The bit lines are selected for a write in the same manner as for a read. In this example, the selection is a one of two selection. The bit line pair associated with a column address is the bit line pair selected for normal operation in which the row addresses for the X-circuitry and Y-circuitry are different. For the X-circuitry, column address CA0X is associated with bit line pair BL0X and BL0Xb, and column address CA1X is associated with bit line pair BL1X and BL1Xb. For the Y-circuitry, column address CA0Y is associated with bit line pair BL0Y and BL0Yb, and column address CA1Y is associated with bit line pair BL1Y and BL1Yb. For a write, R/W X buffer 76 and R/W Y buffer 78 receive the data to be written from global data lines GDLX and GDLY, respectively. R/W X buffer 76 writes the received data onto data line pair DLX and DLXb. R/W Y buffer 78 writes the data onto data line pair DLY and DLYb. Selected columns couple the data on the data lines to their bit lines. For example, if bit lines BL0X and BL0Xb are to be written, then transistors 52 and 54 are made conductive by column address signal CA0X being asserted at a logic high. Similarly, if bit lines BL1Y and BL1Yb are to be written, column address signal CA1Y is asserted and transistors 72 and 74 are conductive to provide data onto the selected bit line pair of BL1Y and BL1Yb.

In the case of a read or write where row addresses match and the column addresses do not match, MATCHR is a logic high so that MATCHRb is a logic low forcing AND gates 82 and 86 to provide a deasserted output at a logic low. Thus even if column address signal CA1Y is a logic high, the transistors 72 and 74 are non-conductive but then AND gate 84 provides a logic high output due to MATCHR being a logic high and MATCHCb being a logic high. MATCHCb is a logic high to indicate that a column match has not occurred. With the output of AND gate 84 at a logic high, transistors 68 and 70 couple bit line pair BL1X and BL1Xb, which are X-circuitry bit lines, to data lines DLY and DLYb, which are Y-circuitry data lines. Thus the bit cell being read or written by the Y-circuitry is read or written by the R/W Y buffer 78 through the X-circuitry bit lines, bit line pair BL1X and BL1Xb. With MATCHR being a logic high, the selected Y row decoder is disabled. Thus for example, if row decoders 30 and 34 of FIG. 1 are both selected then row match detector asserts MATCHR which is received by Y row decoder 34 disabling the Y row decoder. With the Y row decoders disabled, then no word lines of the Y-circuitry are enabled with the result that the memory cells along the selected row are coupled to X-circuitry bit lines only so that the memory cells along the selected row are subjected to the capacitance of only the X-circuitry bit line pair and not the Y-circuitry bit line pair. This has the effect though of the Y-circuitry data being written or read not being present on the Y-circuitry bit lines. Thus, the Y-circuitry data is accessed through pass transistors that are connected to the Y-circuitry data lines and the X-circuitry bit line pair line pair of the column selected by the Y-circuitry column address. The X-circuitry operates normally in that the bit line pair of the column selected by the X-circuitry column address is coupled to the X-circuitry data lines, data lines DLX and DLXb.

For the case where both the column addresses for the X-circuitry and the Y-circuitry and the row addresses for the X-circuitry and the Y-circuitry are the same, both the X-circuitry and the Y-circuitry are addressing the same memory cell. For both a read and a write, the access to the Y-circuitry bit lines is blocked. The only access to the memory cells is through the X-circuitry data lines and X-circuitry bit lines. A write to either the X-circuitry or the Y-circuitry is accomplished through R/W X 76 through data line pair DLX, DLXb and bit line pair BL0X, BL0Xb or BL1X, Bl1Xb to the selected memory cell. R/W Y buffer 78 is not used in case of both ports addressing the same memory cell.

Figure 4:
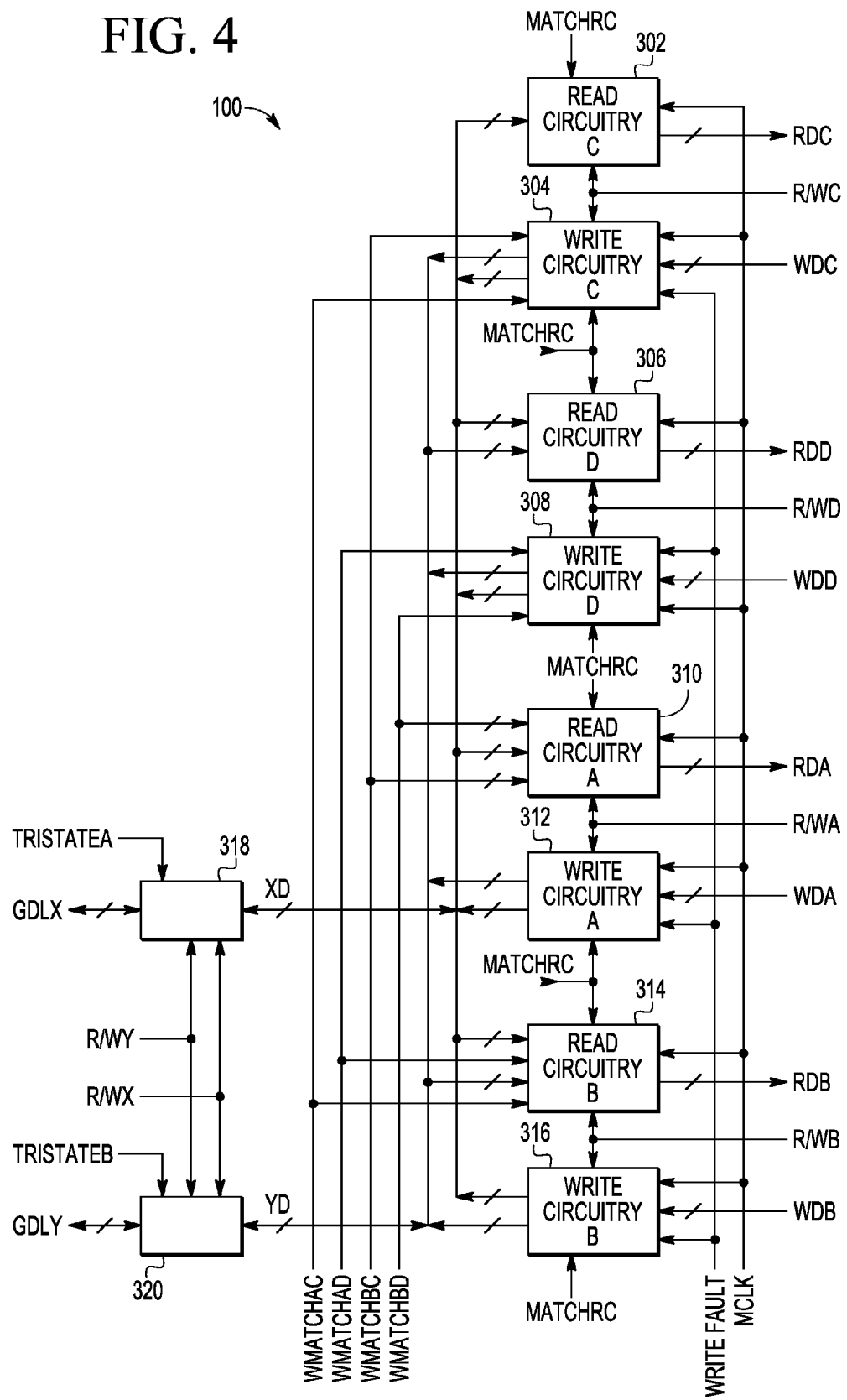
FIG. 4 is a block diagram of a portion of the multi-port memory of FIG. 2, in accordance with an embodiment of the disclosure.

FIG. 4 illustrates R/W circuit 100 in further detail in accordance with one embodiment. R/W circuit 100 is coupled to X-circuitry global data lines (GDLX) and Y-circuitry global data lines (GDLY). R/W circuit 100 includes tristate elements 318 and 320, read circuit 302 for port C, write circuitry 304 for port C, read circuitry 306 for port D, write circuitry 308 for port D, read circuitry 310 for port A, write circuitry 312 for port A, read circuitry 314 for port B, and write circuitry 316 for port B. Tristate element 318 receives TRISTATEA, R/WX, and R/WY. If TRISTATEA is asserted, then tristate element 318 is in high impedance and no information is communicated between GDLX and the read and write circuitries. If TRISTATEA is negated, then GDLX can communicate by way of data signals XD with the read and write circuitries of each port to provide read data or receive write data, based on the R/W signals. Tristate element 320 receives TRISTATEB, R/WX, and R/WY. If TRISTATEB is asserted, then tristate element 320 is in high impedance and no information is communicated between GDLY and the read and write circuitries. If TRISTATEB is negated, then GDLY can communicate by way of data signals YD with the read and write circuitries of each port to provide read data or receive write data, based on the R/W signals.

WMATCHAC is provided to write circuitry 304 for port C and read circuitry 314 for port B. WMATCHAD is provided to write circuitry 308 for port D and read circuitry 314 for port B. WMATCHBC is provided to write circuitry 304 for port C and read circuitry 310 for port A. WMATCHBD is provided to write circuitry 308 for port D and read circuitry 310 for port A. Each of the read and write circuitries receive MATCHRC and MCLK. Read circuitry 302 for port C provides RDC and receives R/WC. Write circuitry 304 for port C receives WDC and R/WC. Read circuitry 306 for port D provides RDD and receives R/WD. Write circuitry 308 for port D receives WDD and R/WD. Read circuitry 310 for port A provides RDA and receives R/WA. Write circuitry 312 for port A receives WDA and R/WA. Read circuitry 314 for port B provides RDB and receives R/WB. Write circuitry 316 receives WDB and R/WB.

In operation, in the case in which there is no row match, for read access requests launched upon the rising edge of MCLK from port A or port B, the data read from the addressed bit cells on port A and port B are provided from GDLX and GDLY, respectively, to data lines XD and YD and to read circuitry 310 for port A and to read circuitry 314 for port B. As discussed above, note that the X-circuitry processes the read access on port A and the Y-circuitry processes the read access on port B. Read circuitry 310 may then output the read data on RDA and read circuitry 314 may then output the read data on RDB. Note that upon the access requests being launched and thus accepted for processing by the X and Y circuitry of memory 10, the stages of the access are self timed and complete within the same phase of MCLK. Therefore, for read access requests launched upon the falling edge of the same cycle of MCLK from port C or port D, the data read from the addressed bit cells on port C and port D are provided from GDLX and GDLY, respectively, to data lines XD and YD and to read circuitry 302 for port C and to read circuitry 306 for port D. As discussed above, note that the X-circuitry processes the read access on port C and the Y-circuitry processes the read access on port D. Read circuitry 302 may then output the read data on RDC and read circuitry 306 may then output the read data on RDD. Upon the subsequent rising edge of MCLK, each of the read circuitries will provide the appropriate read data as RDA, RDB, RDC, and RDD. Note that for read accesses, the read/write signals are all at a logic level high, and the tristate enables TRISTATEA and TRISTATEB are negated so as to allow GDLX and GDLY to communicate to XD and YD. For a NOP access cycle, associated control logic disables any change in the associated read circuitry such that the value of RDA, RDB, RDC, or RDD associated with the NOP remains unchanged from the value of the previous access and the write circuitry makes no change to the value stored in the accessed memory cell.

In the case that there is no row match, for write requests launched upon the rising edge of MCLK from port A or port B, write data for the addressed bit cells by port A are provided by write circuitry A 312 from WDA to XD and to GDLX and the write data for the addressed bit cells by port B are provided by write circuitry B 314 from WDB to YD and to GLDY. As discussed above, the X-circuitry processes the write access on port A and the Y-circuitry processes the write access on port B. Upon the write access requests being launched and thus accepted for processing by the X and Y circuitry of memory 10, the stages of the access are self timed and complete within the same phase of MCLK. Therefore, for write access requests launched upon the falling edge of the same cycle of MCLK from port C or port D, write data for the addressed bit cells by port C are provided by write circuitry C 304 from WDC to XD and to GDLX and the write data for the addressed bit cells by port D are provided by write circuitry D 308 from WDD to YD and to GLDY. As discussed above, the X-circuitry processes the write access on port C and the Y-circuitry processes the write access on port D. Therefore, upon the subsequent rising edge of MCLK, the appropriate write data is stored in the appropriate memory cells addressed by ports A or B. Note that for a port write access, the associated read/write signal is at a logic level low.

In the case that there is both a row and column match for accesses occurring during the same phase of MCLK (in which MATCHRC is a logic level high), then, if both accesses are read accesses, then the same read data on GDLX can be provided to both read circuitry 310 for port A and read circuitry 314 for port B, or the same read data from GDLX can be provided to both read circuitry 302 for port C and read circuitry 306 for port D. That is, only the X-circuitry is used to process the read requests during a phase of MCLK if there is both a row and column match. Note that it is not possible, with both a row match and a column match, to perform a write on each of ports A and B or a write on each of ports C and D, since a conflict of the write data may occur (i.e. the write data on each of ports A and B or on each of ports C and D may differ).

In the case that there is both a row match and column match for accesses occurring during the same phase of MCLK, then, if one access is a read and the other is a write, the write data of the write access can be provided directly as the read data of the other access. In this manner, the read access can be performed without accessing the memory array (i.e. without using the X-circuitry, such as the X word lines and bit lines, or Y-circuitry, such as the Y word lines and bit lines, to access array 12). For example, if, during a phase of MCLK, a read access is being processed by the X-circuitry for port A and a write access is being processed by the Y-circuitry for port B, then the write data received as WDB may be provided by write circuitry 316 for port B to GDLY for storage into the selected memory cells and also be provided to read circuitry 310 for port A to be output as RDA. In this manner, the read access need not wait for completion of the write access and need not use the X-circuitry to access the array. Similarly, if, during a phase of MCLK, a write access is being processed by the X-circuitry for port A and a read access is being processed by the Y-circuitry for port B, then the write data receives as WDA may be provided by write circuitry 312 for port A to GDLX for storage into the selected memory cells and also be provided to read circuitry 314 for port B to be output as RDB. In this manner, the read access need not use the Y-circuitry to access the array.

R/WX and R/WY are provided to control the direction of data flow through tristate circuits 318 and 320 between GDLX and XD and between GDLY and YD. Also, tristate enable signals appropriately enable a high impedance state for tristate circuits 318 and 320 as needed. For example, in the case of both a row match and a column match in which only the X circuitry is used, TRISTATEB can be asserted so as to place tristate circuit 320 in a high impedance state. Similarly, in the case of both a row and column match during a same phase of MCLK in which one access is a read and one is a write, only the circuitry (X or Y circuitry) processing the write is used, and thus the TRISTATE enable for the tristate circuit being utilized for reading is negated and the other is asserted. That is, one of tristate circuits 318 and 320 will be in a high impedance state while the other will allow communication between GDLX and XD or between GDLY and YD, as needed. Furthermore, the signals MATCHRC, as well as R/WA, R/WB, R/WC, and R/WD can be set accordingly to provide the appropriate controls to the read and write circuitries to route the data as described above in those cases in which there is no row match or in those cases in which both a row match and a column match occur.

In memory 10, two ports can be processed in each phase of MCLK. That is, access requests on ports A and B can be processed within a first phase of MCLK cycle and access requests on ports C and D can be processed within a second phase of the same MCLK cycle. In this manner, within a single cycle of MCLK, access requests on all four ports can be processed. As described above, situations in which both a row match and a column match occur for a read and write access during a same phase of MCLK can be handled in such a way that write data of one of the requests can be routed as read data for the other request. Or, in the case of two read requests during a same phase of MCLK in which both a row match and a column match occurs, the X-circuitry may be used to obtain the read data from the selected bitcells and the read data can be provided as the output of both ports. However, since accesses are being processed on each phase of MCLK, it is also possible to have a write address from the second phase of MCLK match a read address from the first phase of MCLK. In this case, a second phase write for a first phase read can be anticipated. For example, if the X-circuitry is processing a read on port A during a first phase of MCLK and the Y-circuitry is processing a write on port C to the same address as the port A address during the second phase of MCLK, this write during the second phase can be anticipated and the write data of the second phase of MCLK can be provided as the output read data corresponding to the read access on port A which was launched during the first phase of MCLK. In this manner, the read access can be performed without accessing the memory array (i.e. without using the X-circuitry, such as the X word lines and bit lines, or Y-circuitry, such as the Y word lines and bit lines, to access array 12).

Figure 5:
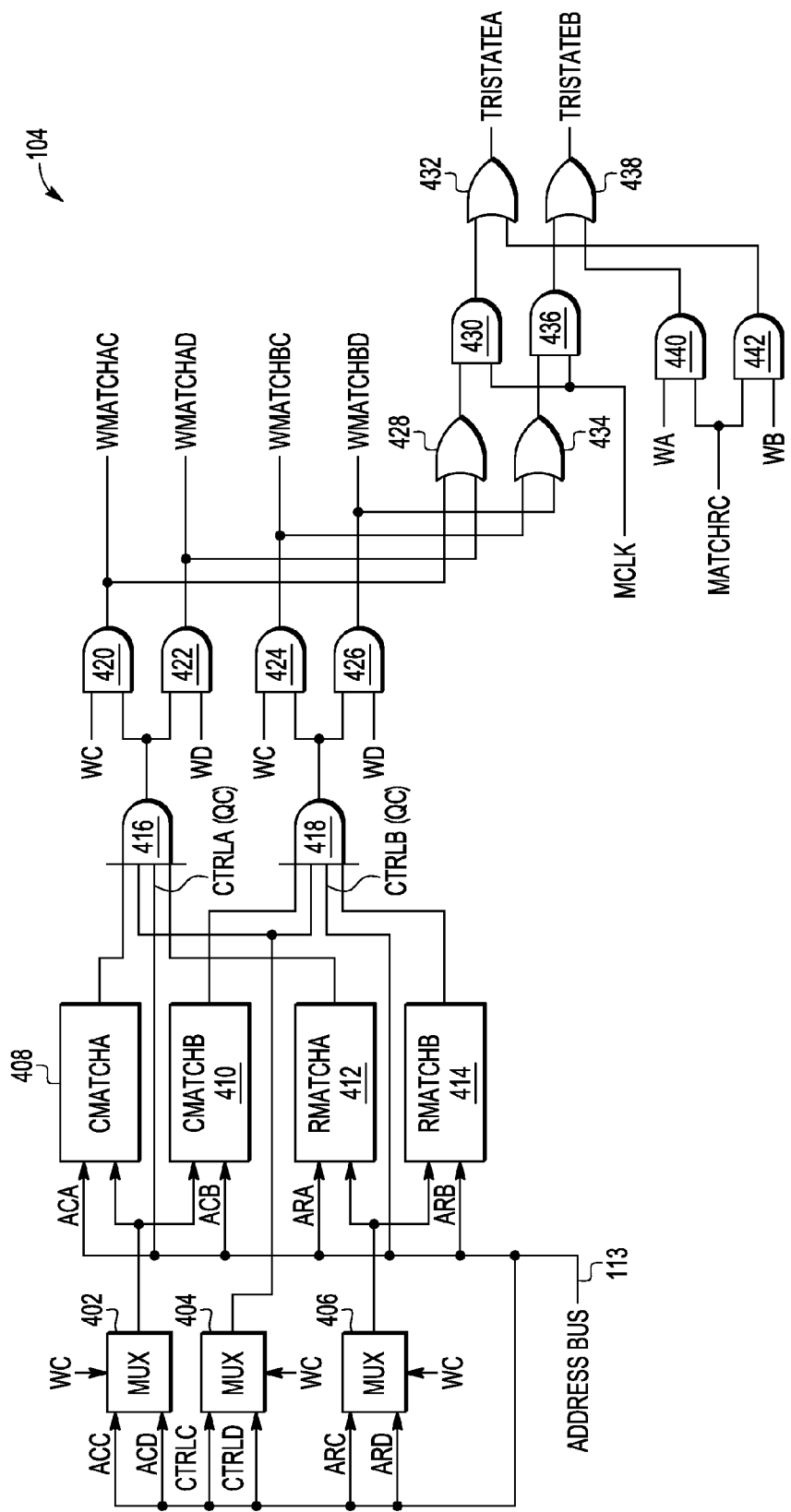
FIG. 5 is a combination logic and block diagram of a portion of the multi-port memory of FIG. 2, in accordance with an embodiment of the disclosure.
Figure 6:
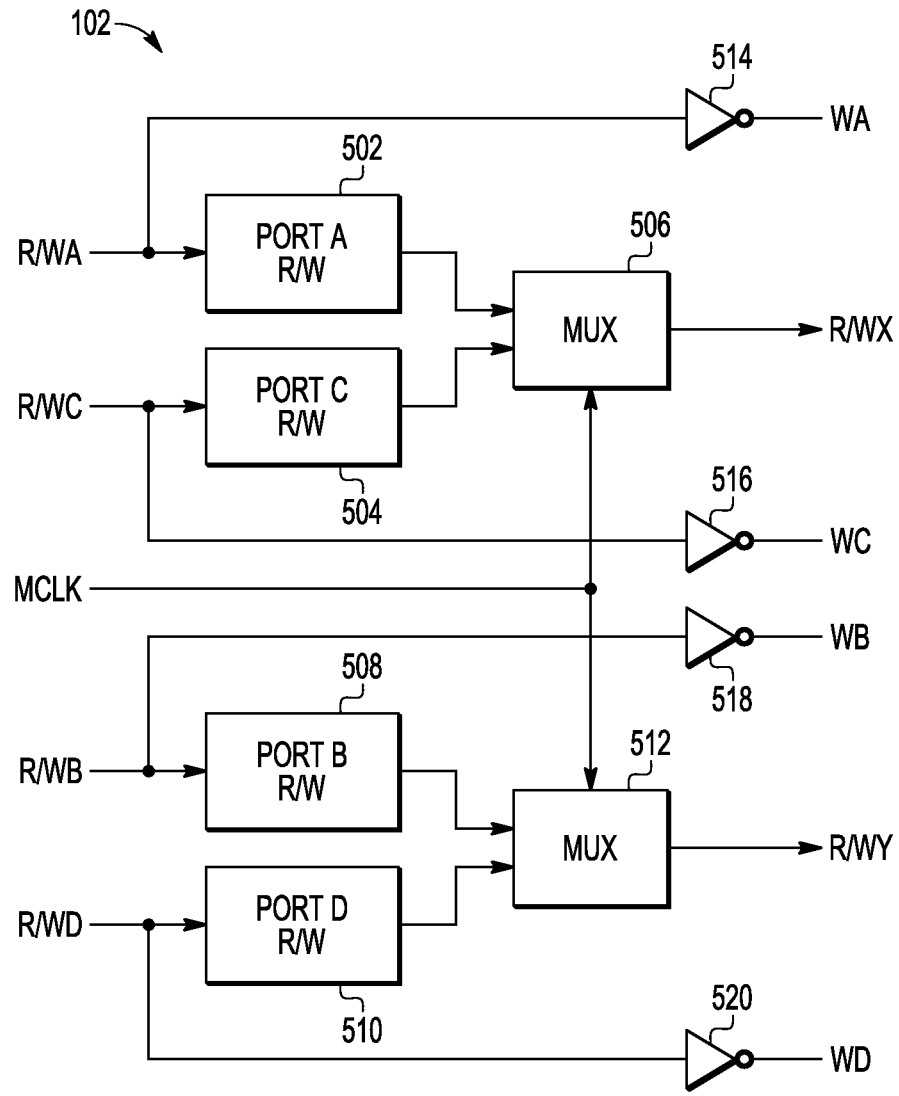
FIG. 6 is a combination logic and block diagram of a portion of the multi-port memory of FIG. 2, in accordance with an embodiment of the disclosure.

FIG. 5 illustrates, in partial block diagram and partial schematic form, a more detailed representation of write match logic 104 of FIG. 2 which outputs WMATCHAC, WMATCHAD, WMATCHBD, WMATCHBC, TRISTATEA and TRISTATEB which are received by read/write circuitry 100 (as illustrated in FIG. 4) and used to appropriately route read and write data. FIG. 6 illustrates, in partial block diagram and partial schematic form, a more detailed representation of read/write MUX logic 102 of FIG. 2 which outputs WA, R/WX, WC, WB, R/WY, and WD. Some of these signals are used by read/write circuitry 100, some are used by write fault detector 600, and some are used by write match logic 104.

Referring first to read/write MUX logic 102 of FIG. 6, read/write MUX logic 102 includes port A R/W logic 502, port C R/W logic 504, port B R/W logic 508, port D R/W logic 510, MUXes 506 and 512, and inverters 514, 516, 518, and 520. R/WA, R/WB, R/WC, R/WD are control signals which may be received with each access request at the corresponding port of memory 10. R/WA is provided to port A R/W logic 502 and to an input of inverter 514. R/WC is provided to port C R/W logic 504 and to an input of inverter 516. R/WB is provided to port B R/W logic 508 and to an input of inverter 518. R/WD is provided to port D R/W logic 510 and to an input of inverter 520. An output of port A R/W logic 502 is provided to a first data input of MUX 506, an output of port C R/W logic 504 is provided to a second data input of MUX 506, and a data output of MUX 506 provides R/WX. An output of port B R/W logic 508 is provided to a first data input of MUX 512, an output of port D R/W logic 510 is provided to a second data input of MUX 512, and a data output of MUX 512 provides R/WY. MCLK is provided to control inputs of each of MUXes 506 and 512. An output of inverter 514 provides WA, an output of inverter 516 provides WC, an output of inverter 518 provides WB, and an output of inverter 520 provides WD.

In operation, during a first phase of MCLK (when MCLK is a logic level high), in which the X-circuitry is processing an access request from port A and the Y-circuitry is processing an access request from port B, R/WA is provided as R/WX and R/WB is provided as R/WY. However, during the second phase of MCLK (when MCLK is a logic level low), in which the X-circuitry is processing an access request from port C and the Y-circuitry is processing an access request from port D, R/WC is provided as R/W X and R/WD is provided as R/WY. Note that if R/WA is asserted, port A received a read request, and if R/WA is negated, port A received a write request. Therefore, WA is asserted when R/WA is negated. Thus, assertion of WA indicates that port A has a write request. Similarly, if R/WC is asserted, port C received a read request, and if R/WC is negated, port C received a write request. Therefore, WC is asserted when R/WC is negated. Thus, assertion of WC indicates that port C has a write request. Similarly, if R/WB is asserted, port B received a read request, and if R/WB is negated, port B received a write request. Therefore, WB is asserted when R/WB is negated. Thus, assertion of WB indicates that port B has a write request. Similarly, if R/WD is asserted, port D received a read request, and if R/WD is negated, port D received a write request. Therefore, WD is asserted when R/WD is negated. Thus, assertion of WD indicates that port D has a write request.

Referring back to FIG. 5, write match logic 104 includes MUXes 402, 404, and 406, CMATCHA logic 408, CMATCHB logic 410, RMATCHA logic 412, RMATCHB logic 414, AND gates 416, 418, 420, 422, 424, 426, 430, 436, 440, and 442, and OR gates 428, 434, 432, and 438. ACC (the port C column address) is provided from address bus 113 to a first input of MUX 402, and ACD (the port D column address) is provided from address bus 113 to a second input of MUX 402. WC is provided to the control input of MUX 402. CTRLC (which includes QC for port C) is provided from address bus 113 to a first input of MUX 404, and CTRLD (which includes QC for port D) is provided from address bus 113 to a second input of MUX 404. WC is provided to the control input of MUX 404. ARC (the port C row address) is provided from address bus 113 to a first input of MUX 406, and ARD (the port D row address) is provided from address bus 113 to a second input of MUX 406. WC is provided to the control input of MUX 406. ACA (the port A column address) is provided from address bus 113 to a first input of CMATCHA logic 408, and an output of MUX 402 is provided to a second input of CMATCHA logic 408 and to a first input of CMATCHB logic 410. ACB (the port B column address) is provided from address bus 113 to a second input of CMATCHB logic 410. ARA (the port A row address) is provided from address bus 113 to a first input of RMATCHA logic 412, and an output of MUX 406 is provided to a second input of RMATCHA logic 412 and to a first input of RMATCHB logic 414. ARB (the port B row address) is provided from address bus 113 to a second input of RMATCHB logic 414. A first input of AND gate 416 receives an output of CMATCHA logic 408, a second input of AND gate 416 receives an output of MUX 404, a third input of AND gate 416 receives QC of CTRLA, and a fourth input of AND gate 416 receives an output of RMATCHA logic 412. A first input of AND gate 418 receives an output of CMATCHB logic 410, a second input of AND gate 418 receives the output of MUX 404, a third input of AND gate 418 receives QC of CTRLB, and a fourth input of AND gate 418 receives an output of RMATCHB logic 414. A first input of AND gate 420 receives WC, and a second input of AND gate 420 receives an output of AND gate 416. A first input of AND gate 422 receives the output of AND gate 416 and a second input of AND gate 422 receives WD. A first input of AND gate 424 receives WC, and a second input of AND gate 424 receives an output of AND gate 418. A first input of AND gate 426 receives the output of AND gate 418, and a second input of AND gate 426 receives WD. An output of AND gate 420 provides WMATCHAC, an output of AND gate 422 provides WMATCHAD, an output of AND gate 424 provides WMATCHBC, and an output of AND gate 426 provides WMATCHBD. A first input of OR gate 428 receives WMATCHAC, and a second input of OR gate 428 receives WMATCHAD. A first input of OR gate 434 receives WMATCHBC, a second input of OR gate 434 receives WMATCHBD. A first input of AND gate 430 receives an output of OR gate 428, and a second input of AND gate 430 receives MCLK. A first input of AND gate 436 receive an output of OR gate 434, and a second input of AND gate 436 receives MCLK. A first input of AND gate 440 receives WA, a second input of AND gate 440 receives MATCHRC. A first input of AND gate 442 receives MATCHRC, and a second input of AND gate 442 receives WB. A first input of OR gate 432 receives an output of AND gate 430, and a second input of OR gate 432 receives an output of AND gate 442. An output of OR gate 432 provides TRISTATEA. A first input of OR gate 438 receives an output of AND gate 436, and a second input of OR gate 438 receives an output of AND gate 440. An output of OR gate 438 provides TRISTATEB.

In operation, it is assumed that only port C or port D, in a second phase of MCLK, can be performing a write. WC, when asserted, indicates that port C is processing a write (assuming the cycle was not a NOP). (Note that it is also possible that neither port C or port D is performing a write.) When WC is asserted, ACC is provided at the output of MUX 402, CTRLC is provided at the output of MUX 404, and ARC is provided at the output of MUX 406. When WC is negated, it indicates that port D may be processing a write, therefore, ACD is provided at the output of MUX 402, CTRLD is provided at the output of MUX 404, and ARC is provided at the output of MUX 406. Match logics 408, 410, 412, and 414 each assert their corresponding output when a match is found between their corresponding two inputs. For example, in the case when WC is asserted and port C is processing a write request, CMATCHA logic 408 asserts its output when ACA matches ACC and CMATCHB logic 410 asserts its output when ACC matches ACB. That is, the column address of port C can match either the column address of port A or the column address of port B, and the outputs of CMATCHA logic 408 and CMATCHB 410 are asserted accordingly. In the case when WC is asserted, RMATCHA logic 412 asserts its output when ARA matches ARC, and RMATCHB logic 414 asserts its output when ARC matches ARB. That is, the row address of port C can match either the row address of port A or the row address of port B. Still assuming that WC is asserted, the output of AND gate 416 is asserted when the column and row addresses of port A match the column and row addresses of port C and each of ports A and C have a valid write address (as opposed to a NOP) in which QC for each port is asserted. Therefore, if WC is asserted and the output of AND gate 416 is asserted, WMATCHAC is asserted by AND gate 420 to indicate that a write address for a write on port C matches a read address on port A. Similar operation occurs if WC is negated and WD is instead asserted. That is, if WD is asserted and the output of AND gate 416 is asserted, WMATCHAD is asserted by AND gate 420 to indicate that a write address for a write on port D matches a read address on port A.

Assuming again that WC is asserted, the output of AND gate 418 is asserted when the column and row address of port B match the column and row address of port C and each of ports B and C have a valid write address (as opposed to a NOP) in which QC for each port is asserted. Therefore, if WC is asserted and the output of AND gate 418 is asserted, WMATCHBC is asserted by AND gate 424 to indicate that a write address for a write on port C matches a read address on port B. Similar operation occurs if WC is negated and WD is instead asserted. That is, if WD is asserted and the output of AND gate 418 is asserted, WMATCHBD is asserted by AND gate 426 to indicate that a write address for a write on port D matches a read address on port B.

Therefore, if any one of signals WMATCHAC, WMATCHAD, WMATCHBC, and WMATCHBD is asserted, it is known that a write to a particular address is processed in a second phase of MCLK after a read to the same particular address is processed in the first phase of MCLK. That is, in the second phase of MCLK, if a write is launched on port C or port D after a read was launched in the first phase of MCLK on port A or B to a same address, the write data of the second phase can be routed as the read data output for the first phase of MCLK. Referring to FIG. 5, note that during the first phase of MCLK, when MATCHRC is asserted, a row and column match is indicated between the access request processed by port A and port B. Note that if MATCHRC is asserted, both ports A and B cannot be performing a write. That is, either both can be performing a read, or one can be performing a read and the other a write. Therefore, when MATCHRC is asserted, and a write is occurring on port A, the output of AND gate 440 is asserted and the output of AND gate 442 is negated. When MATCHRC is asserted, and a write is occurring on port B, the output of AND gate 442 is asserted and the output of AND gate 440 is negated. These outputs are also used to control the outputs of OR gates 432 and 438.

Still referring to FIG. 5, if during the first phase of MCLK (when MCLK is a logic level high), there is a row and column address match between a read on port A and a write on port C or D, the output of AND gate 430 (and thus the first input to OR gate 432) is asserted (e.g. a logic level high). Therefore, during the first phase of MCLK, if (1) there is a row and column address match between a read on port A and a write on port C or D or if (2) there is a write occurring on port B with a row and column address match with a read occurring on port A, TRISTATEA is asserted thus placing tristate unit 318 (in FIG. 4) in high impedance such that GDLX does not communicate with XD. Since the write data from the write occurring on port C or D (as in case (1)) or the write occurring on port B (as in case (2)) can be provided directly as the read data, a read of the addressed memory cells by the X or Y circuitry need not be performed. For example, in case (1) in which a write is occurring on port C or D during the second phase of MCLK, the write data from port C or D (WDC or WDD) can be provided from the appropriate write circuitry 304 or 308 in FIG. 4 to read circuitry A 310. For example, in case (2) in which a write is occurring on port B during the first phase of MCLK, the write data from port B (WDB) can be provided from write circuitry B 316 to read circuitry A 310.

Analogous operation applies to the generation of TRISTATEB. Therefore, during the first phase of MCLK, if (1) there is a row and column address match between a read on port B and a write on port C or D of if (2) there is a write occurring on port A with a row and column address match with a read occurring on port B, TRISTATEB is asserted thus placing tristate unit 320 (in FIG. 4) in high impedance such that GDLY does not communicate with YD. Since the write data from the write occurring on port C or D (as in case (1)) or the write occurring on port A (as in case (2)) can be provided directly as the read data, a read of the addressed memory cells by the X or Y circuitry need not be performed. Note that the control signals WMATCHAC, WMATCHAD, WMATCHBC, and WMATCH BD, along with MATCHRC and MCLK, can be used by read/write circuitry 100 as illustrated in FIG. 4 to route the read and write data as described above, accordingly.

Figure 7:
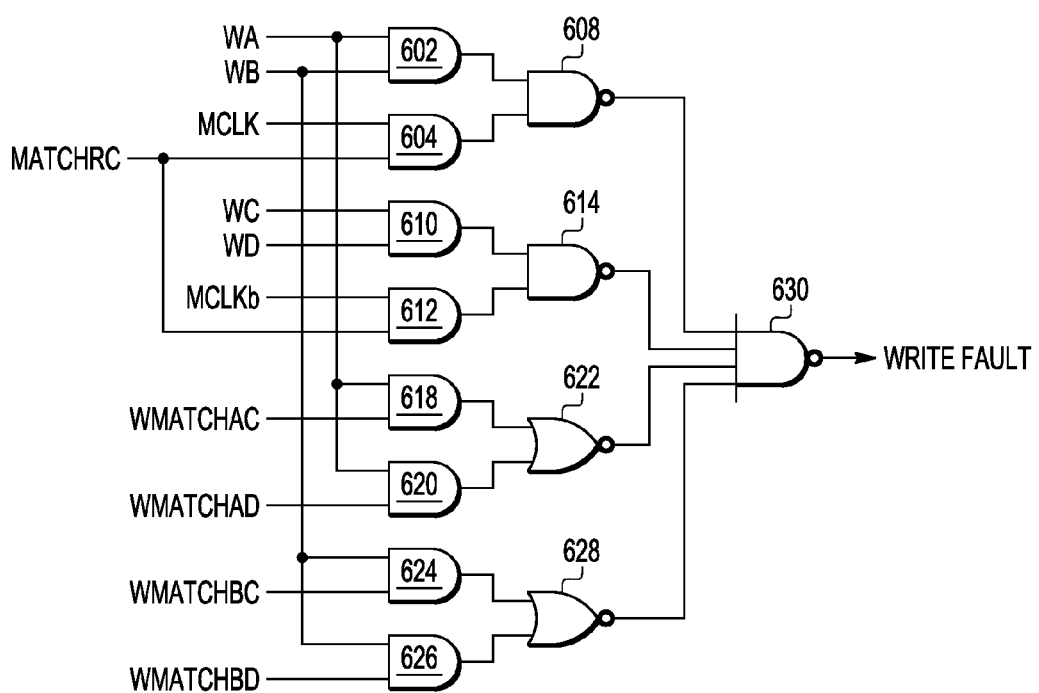
FIG. 7 is a logic diagram of write fault logic which may be used within the memory system of FIG. 1, in accordance with an embodiment of the disclosure.

FIG. 7 illustrates in schematic form one embodiment of write fault logic 600 which may be used to generate a WRITE FAULT signal which can indicate to read/write circuit 100 occurrence of a write fault. Write fault logic 600 includes AND gates 602, 604, 610, 612, 618, 620, 624, and 626, NAND gates 608, 614, and 630, and NOR gates 622 and 628. A first input of AND gate 602 receives WA and a second input of AND gate 602 receives WB. A first input of AND gate 604 receives MCLK and a second input of AND gate 604 receives MATCHRC. A first input of AND gate 610 receives WC, and a second input of AND gate 610 receives WD. A first input of AND gate 612 receives MCLKb, and a second input of AND gate 612 receives MATCHRC. A first input of AND gate 618 receives WA and a second input of AND gate 618 receives WMATCHAC. A first input of AND gate 620 receives WA and a second input of AND gate 620 receives WMATCHAD. A first input of AND gate 624 receives WB, and a second input of AND gate 624 receives WMATCHBC. A first input of AND gate 626 receives WB and a second input of AND gate 626 receives WMATCHBD. A first input of NAND gate 608 is coupled to an output of AND gate 602 and a second input of NAND gate 608 is coupled to an output of AND gate 604. A first input of NAND gate 614 is coupled to an output of AND gate 610 and a second input of NAND gate 614 is coupled to an output of AND gate 612. A first input of NOR gate 622 is coupled to an output of AND gate 618, and a second input of NOR gate 622 is coupled to an output of AND gate 620. A first input of NOR gate 628 is coupled to an output of AND gate 624, and a second input of NOR gate 628 is coupled to an output of AND gate 626. A first input of NAND gate 630 is coupled to an output of NAND gate 608, a second input of NAND gate 630 is coupled to an output of NAND gate 614, a third input of NAND gate 630 is coupled to an output of NOR gate 622, and a fourth input of NAND gate 630 is coupled to an output of NOR gate 628. An output of NAND gate 630 provides WRITE FAULT, which when asserted (e.g. a logic level high), indicates a write fault (i.e. an illegal write) has occurred.

In operation, write fault logic 600 asserts WRITE FAULT when various of the unallowed write scenarios described above have occurred. Note that when any of the inputs to NAND gate 630 is a logic level low, WRITE FAULT will be asserted to a logic level high. For example, when, during a first phase of MCLK, MATCHRC is asserted (thus indicating a row and column match between ports A and B during this first phase of MCLK), a write cannot be performed on both port A and port B. Therefore, if a write is on both ports A and B, then WA and WB are both asserted and the outputs of AND gates 602 and 604 are logic level highs, and the output of NAND gate 608 is a logic level low. This results in WRITE FAULT being asserted. Similarly, when, during a second phase of MCLK, MATCHRC is asserted (thus indicating a row and column match between ports C and D during this second phase of MCLK), a write cannot be performed on both port C and port D. If a write is on both ports C and D, then WC and WD are both asserted and the outputs of AND gates 610 and 612 are logic level highs, and the output of NAND gate 614 is a logic level low. This also results in WRITE FAULT being asserted.

Also, when there is an address match on port A with a write address on either port C or port D, port A cannot be a write. Therefore, if WA is asserted (indicating a write on port A) and either of WMATCHAC or WMATCHAD is asserted the output of NOR gate 622 is a logic level low. This also results in WRITE FAULT being asserted. Similarly, when there is an address match on port B with a write address on either port C or port D, port B cannot be write. Therefore, if WB is asserted (indicating a write on port B) and either of WMATCHBC or WMATCHBD is asserted, the output of NOR gate 628 is a logic level low. This also results in WRITE FAULT being asserted.

Figure 8:
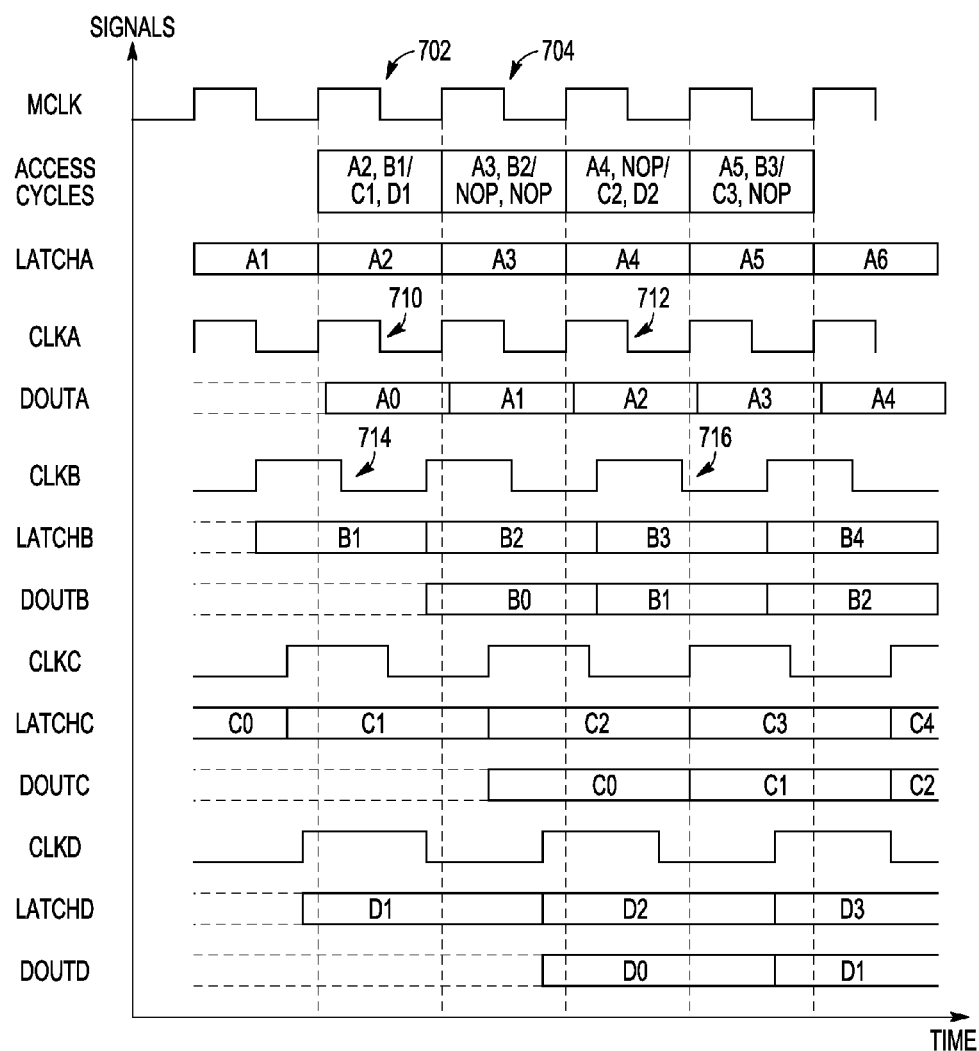
FIGS. 8 and 9 are timing diagrams of various signals of the memory system of FIG. 1, in accordance with example operation of the memory system of FIG. 1.
Figure 9:
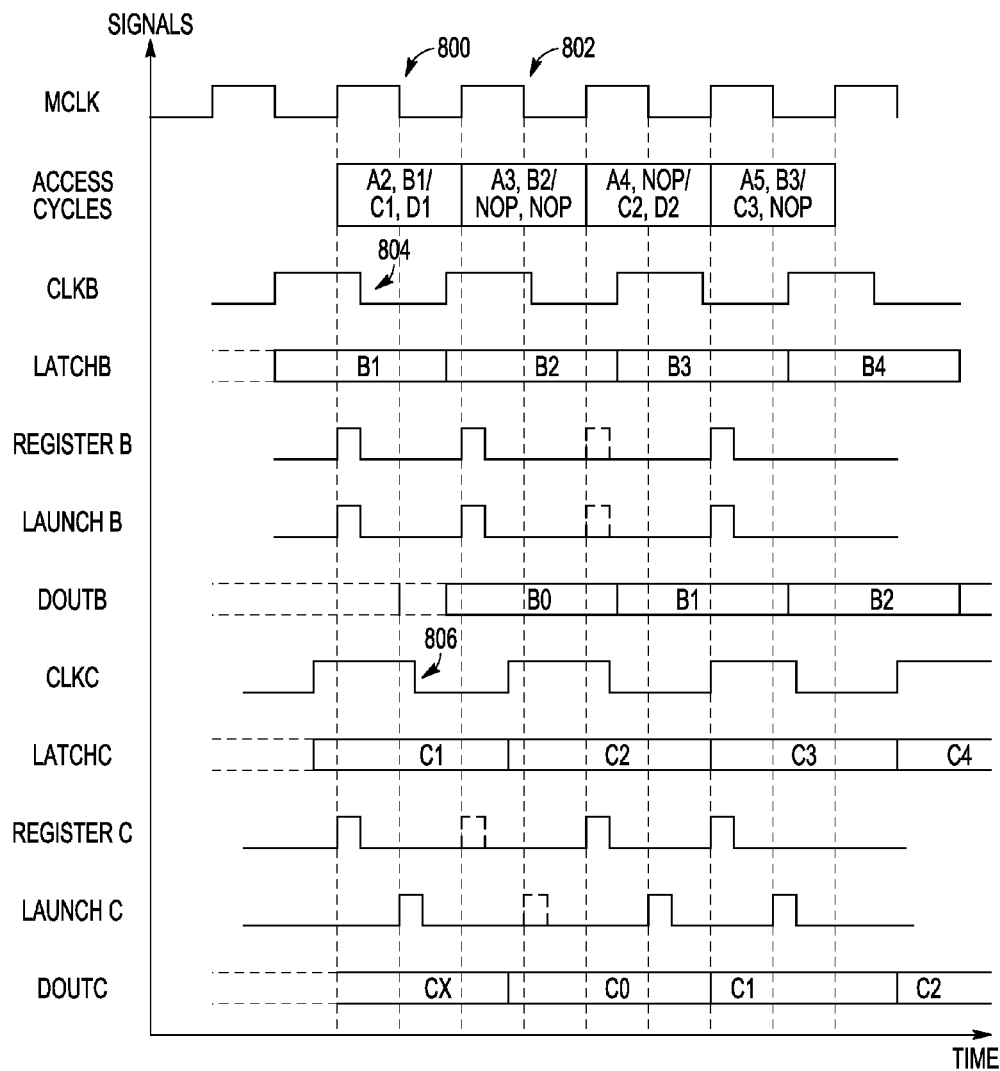

FIGS. 8 and 9 illustrate timing diagrams which include various signals of memory system 200 during example operations of memory system 200. The timing diagram illustrates how read address cycles are processed by system 200 in which, from the time an address is latched at a particular port, the data is available at the output in two clock cycles of the port clock. For example, address A2 for a read access is latched in latch A at clock cycle 710 of CLKA and the read data for A2 is provided as DOUTA in clock cycle 712 of CLKA, which is two clock cycles of CLKA later. Note that the read request for address A2 can be processed by memory 10 within one clock cycle of MCLK. Therefore, A2 is launched in the first phase of MCLK cycle 702, and is available as RDA by the rising edge of the next cycle 704 of MCLK.

In the example of FIG. 8, read request addresses A2, B1, C1, and D1 are all available at the corresponding port latches prior to the rising edge of MCLK cycle 702 and are thus all qualified at the rising edge of MCLK cycle 702. Addresses A2 and B1 are launched in the first phase of cycle 702 and address C1 and D1 are launched in the second phase of cycle 702. The read data are available at the output of memory 10 as RDA, RDB, RDC, and RDD by the end of cycle 702. The read data is then pushed onto the corresponding FIFOs (as was described above in reference to FIG. 1) in accordance with MCLK, and the read data is then available to output from system 200 in accordance with the corresponding port clock. For example, the data for address B1 is provided in cycle 716 of CLKB when it was latched by portB latches 204 and is provided as DOUTB two cycles later in cycle 716 of CLKB. The same applies to each of the read data for C1 and D1 which are provided as DOUTC and DOUTD, respectively, within 2 clock cycles of CLKC and CLKD, respectively. Therefore, in each clock cycle of MCLK, up to 4 accesses may be processed, and the accesses are completed within 2 clock cycles of the corresponding port clock.

Note that in some clock cycles of MCLK, an address for a next access on a particular port may not be available for launching. For example, in clock cycle 704 of MCLK, the next address on port C after C1, which is C2, was not available in time to be qualified by the rising edge of cycle 704 of MCLK and thus was also not launched in the second phase of cycle 704. The same is true for the next address on port D after D1, which is D2, which was not available in time to be qualified and launched in cycle 704 of MCLK. Therefore, NOPs are performed instead. As discussed above, for these two accesses, the QC signal in each of CTRLC and CTRLD would not be asserted upon the rising edge of cycle 704 of MCLK, and these negated QC signals indicate that NOPs rather than valid accesses are occurring during the second phase of cycle 704.

Referring to the timing diagram of FIG. 9, signals from ports B and C are illustrated in which signals from ports A and D are not illustrated, for simplicity. FIG. 9 illustrates further details with respect to addresses being qualified and launched. Note that launch signals, LAUNCH B and LAUNCH C, are provided as part of CTRLB and CTRLC, respectively. Again, it is assumed that the example addresses (such as A2, B1, C1, D1, etc.) correspond to read accesses. In cycle 804 of CLKB, address B1 is latched into portB latches 204. Since B1 is available at the subsequent rising edge of MCLK (of cycle 800 of MCLK), B1 is qualified (the corresponding QC is asserted) and thus corresponds to a valid access request for cycle 800 of MCLK. Also, C1 is latched into port C latches 206 in cycle 806 of CLKC. Since C1 is available prior to the rising edge of cycle 800 of MCLK, it is also qualified for cycle 800 (the corresponding QC is asserted). In the illustrated embodiment, all of A2, B1, C1, and D1 are qualified for processing in cycle 800 of MCLK. Therefore, note that the corresponding QC signal of each of CTRLA, CTRLB, CTRLC, and CTRLD is asserted for cycle 800 of MCLK. Also, since B1 is processed during the first phase of cycle 800, LAUNCH B is asserted at the rising edge of cycle 800 of MCLK, thus launching the read access to address B1 in the first phase. However, C1 is processed during the second phase of cycle 800, therefore, LAUNCH C is not asserted until the falling edge within cycle 800 of MCLK, thus launching the read access to address C1 in the second phase. Again, as in FIG. 8, the read data for each of B1 and C1 is illustrated as being available as DOUTB and DOUTC within 2 clock cycles of CLKB and CLKC from when its latched.

As discussed with respect to FIG. 8, not all addresses received at the port latches are received in time and thus are not qualified. These are processed as NOPS. For example, C2 is not latched in time to qualify for cycle 802 of MCLK. Therefore, it is treated as a NOP. Since it is a NOP, though, note that no launch signal is asserted, as indicated by the dotted line pulse for LAUNCH C at the falling edge of MCLK within cycle 802. Had there been a valid address qualified for cycle 802 from port C, then LAUNCH C would have been asserted at the failing edge of cycle 802. Also, note that for the NOPS, there is no corresponding read data to be pushed onto the corresponding FIFO for that access cycle.

Thus it is shown that a technique for accessing a multiple port memory can achieve avoiding adding capacitance that would normally occur when two ports are accessing along the same row. Additionally, it has been shown that bit cell instability associated with two word lines accessing a common bit cell at the same time can be avoided. Accessing along the same row can easily result in multiple bit lines being coupled to the same memory cell. This adds capacitance which can slow down reading especially. Furthermore, it has been appreciated how a dual port memory can be expanded to process four requests per cycle of the memory clock (e.g. MCLK) by controlling the launching on each port to be within one of the first or second phase of a clock cycle of MCLK. Also, it has been appreciated how each port of system 200 is capable of receiving access requests and providing outputs of the access requests in accordance with clocks that are different than the clock of the multiple port memory itself. So long as the clock with which each port operates of system 200 (e.g. CLKA, CLKB, CLKC, CLKD) are the same speed or slower than the memory clock (e.g. MCLK), the outputs at each port of system 200 (e.g. DOUTA, DOUTB, DOUTC, and DOUTD) can be provided at two clock cycles of the clock with which the port operates.

The terms "assert" or "set" and "negate" (or "deassert" or "clear") are used herein when referring to the rendering of a signal, status bit, or similar apparatus into its logically true or logically false state, respectively. If the logically true state is a logic level one, the logically false state is a logic level zero. And if the logically true state is a logic level zero, the logically false state is a logic level one.

Because the apparatus implementing the present invention is, for the most part, composed of electronic components and circuits known to those skilled in the art, circuit details will not be explained in any greater extent than that considered necessary as illustrated above, for the understanding and appreciation of the underlying concepts of the present invention and in order not to obfuscate or distract from the teachings of the present invention.

Although the disclosure is described herein with reference to specific embodiments, various modifications and changes can be made without departing from the scope of the present invention as set forth in the claims below. For example, although the disclosure was described in the context of two ports, it may be applied to memory architectures in which there are more than two ports. Accordingly, the specification and figures are to be regarded in an illustrative rather than a restrictive sense, and all such modifications are intended to be included within the scope of the present invention. Any benefits, advantages, or solutions to problems that are described herein with regard to specific embodiments are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The following are various embodiments of the present invention.

Item 1 includes a method which includes providing a memory system comprising a first port a second port, a third port, a fourth port, an array of memory cells, a first set of word lines and bit lines coupled to the memory cells, a second set of word lines and bit lines coupled to the memory cells, and a system clock in which each cycle has a first phase and a second phase; applying a first clock, a first row address, and a first column address to the first port; applying a second clock, a second row address, and a second column address to the second port, applying a third clock, a third row address, and third column address, to the third port; applying a fourth clock, a fourth row address, and a fourth column address to the fourth port; and performing accesses to the array through: the first port responsive to the system clock entering the first phase of a first cycle of the system clock and the first clock being active using the first set of word lines and bit lines during the first phase of the first cycle; the second port responsive to the system clock entering the first phase of the first cycle and the second clock being active using the second set of word lines and bit lines if the first row address is different from the second row address during the first phase of the first cycle; the third port responsive to the system clock entering the first phase of the first cycle and the third clock being active using the first set of word lines and bit lines during the second phase of the first cycle; and the fourth port responsive to the system clock entering the first phase of the first cycle and the fourth clock being active using the second set of word lines and bit lines if the third row address is different from the fourth row address during the second phase of the second cycle. Item 2 includes the method of item 1, wherein when the performing the accesses is further characterized by the access performed by the first port being a write, the access performed by the second port being a read, the first row address is the same as the second row address, and the first column address is the same as the second column address, the second port provides data written by the first port to the memory array as an output of the second port through circuitry not including either the first set of word lines and bit lines or the second set of word lines and bit lines. Item 3 includes the method of item 2, wherein, when the performing the accesses is further characterized by the access performed by the first port being a write, the access performed by the third port being a read, the first row address is the same as the third row address, and the first column address is the same as the third column address, the third port provides data by accessing the array. Item 4 includes the method of item 2, wherein, when the performing the accesses is further characterized by the access performed by the first port being a write, the access performed by the fourth port being a read, the first row address is the same as the fourth row address, and the first column address is the same as the fourth column address, the fourth port provides data by accessing the array. Item 5 includes the method of item 1, wherein the step of providing is further characterized by the first phase being from a rising edge of the system clock to a falling edge of the system clock and the second phase being from the falling edge of the system clock to the next rising edge of the system clock. Item 6 includes the method of item 5, wherein the performing the accesses uses a launch controller to determine if an access is to be performed for the first, second, third and fourth ports in response to the rising edge of the first cycle of the system clock. Item 7 includes the method of item 6, and further includes outputting data on the first port after the rising edge that ends the second phase of the first cycle of the system clock in response to a second cycle of the first clock immediately following the cycle after the first cycle of the first clock. Item 8 include the method of item 1, wherein the performing the accesses is further characterized for the case of the accesses including a read through the first port in which the first cycle of the system clock is entered during a first cycle of the first clock and a result of the read is available on the first port on the beginning of the third cycle of the first port clock after the applying of the first port clock. Item 9 includes the method of item 1, wherein the providing is further characterized as providing a first row decoder coupled to the first port and the third port and to the word lines of the first set of word lines and bit lines and a second row decoder coupled to the second port and the fourth port and to the word lines of the second set of word lines and bit lines. Item 10 includes the method of item 9, wherein the performing the accesses is further characterized by the first row decoder selecting a word line, based on the first row address, of the first set of word lines and bit lines during the first phase of the first cycle and selecting a word line, based on the third row address, of the first set of word lines and bit lines during the second phase of the first cycle.

Item 11 includes a memory system, including an array of memory cells coupled to a first set of word lines and bit lines and a second set of word lines and bit lines; column circuitry coupled to the bit lines of the first and second sets; row decoders coupled to the word lines of the first and second sets; a first port, responsive to a first clock and system clock, that receives a first row address and a first column address and has a first input circuit and a first output circuit; a second port, responsive to a second clock and the master clock, that receives a second row address and a second column address and has a second input circuit and a second output circuit; a third port, responsive to a third clock and the master clock, that receives a third row address and a third column address and has a third input circuit and a third output circuit; and a fourth port, responsive to a fourth clock and the master clock, that receives a fourth row address and a fourth column address and has a fourth input circuit and a fourth output circuit; wherein: for each cycle of the master clock there is a first phase and a second phase; during the first phase, when the first row address is different than the second row address, the first port accesses the memory array using the first set through the row decoders and the column circuitry and the second port accesses the memory array using the second set through the row decoders and the column circuitry; and during the second phase, when the third row address is different than the fourth address, the third port accesses the memory array using the first set through the row decoders and the column circuitry and the fourth port accesses the memory array using the second set through the row decoders and the column circuitry. Item 12 includes the memory system of item 11, wherein the first row address is read by the first port at a beginning of a first cycle of the first clock that immediately precedes the first phase. Item 13 includes the memory system of item 12, wherein, when the access is a read, data is output by the first port at a beginning of a third cycle of the first clock immediately following the first cycle of the first clock. Item 14 includes the memory system of item 12, wherein: the second row address is read by the second port at a beginning of a first cycle of the second clock that immediately precedes the first phase; and when: the access performed by the first port is a write; the access performed by the second port is a read; the first row address is the same as the second row address; and the first column address is the same as the second column address, the second port provides data written by the first port to the memory array as an output of the second port through circuitry not including either the first set of word lines and bit lines or the second set of word lines and bit lines. Item 15 includes the memory system of item 11, wherein during the first phase when the first row address is the same as the second row address, the first port and the second port use a word line of the first set of word lines and bit lines that is selected by the first row address to access the memory array. Item 16 includes the memory system of item 11, wherein the master clock has a frequency at least as great as that of the first, second, third, and fourth clocks. Item 17 includes the memory system of item 11, wherein: when: the access performed by the third port is a write; the access performed by the fourth port is a read; the third row address is the same as the fourth row address; and the third column address is the same as the fourth column address, the fourth port provides data written by the third port to the memory array as an output of the fourth port through circuitry not including either the first set of word lines and bit lines or the second set of word lines and bit lines.

Item 18 includes a method of operating a multiport asynchronous memory having a memory array accessed in response to a master clock, which has a first phase and a second phase for each cycle, through a first set of word lines and bit lines and a second set of word lines and bit lines, including: using a first port to access the memory array during the first phase of the master clock through the first set of word lines and bit lines responsive to a first row address and a first column address clocked by a first clock; using a second port to access the memory array during the first phase of the master clock through the second set of word lines and bit lines responsive to a second row address and a second column address clocked by a second clock when the second row address is different from the first row address; using a third port to access the memory array during the second phase of the master clock through the first set of word lines and bit lines responsive to a third row address and a third column address clocked by a third clock; and using a fourth port to access the memory array during the second phase of the master clock through the second set of word lines and bit lines responsive to a fourth row address and a fourth column address clocked by a fourth clock when the fourth row address is different from the third row address. Item 19 includes the method of item 18, wherein when access is a read and the first address is the same as the second address, the using the second port is further characterized by using the word lines of the first set of word lines and bit lines. Item 20 includes the method of item 18, wherein when the access for the first port is a write and the access for the second port is a read, the using the second port is further characterized as using circuitry other than either the first set of word lines and bit lines or the second set of word lines and bit lines.

What is claimed is:

1. A method, comprising:
   providing a memory system comprising a first port a second port, a third port, a fourth port, an array of memory cells, a first set of word lines and bit lines coupled to the memory cells, a second set of word lines and bit lines coupled to the memory cells, and a system clock in which each cycle has a first phase and a second phase;
   applying a first clock, a first row address, and a first column address to the first port;
   applying a second clock, a second row address, and a second column address to the second port;
   applying a third clock, a third row address, and third column address, to the third port;
   applying a fourth clock, a fourth row address, and a fourth column address to the fourth port; and
   performing accesses to the array through:
      the first port responsive to the system clock entering the first phase of a first cycle of the system clock and the first clock being active using the first set of word lines and bit lines during the first phase of the first cycle;
      the second port responsive to the system clock entering the first phase of the first cycle and the second clock being active using the second set of word lines and bit lines if the first row address is different from the second row address during the first phase of the first cycle;
      the third port responsive to the system clock entering the first phase of the first cycle and the third clock being active using the first set of word lines and bit lines during the second phase of the first cycle; and
      the fourth port responsive to the system clock entering the first phase of the first cycle and the fourth clock being active using the second set of word lines and bit lines if the third row address is different from the fourth row address during the second phase of the second cycle.

2. The method of claim 1, wherein, when the performing the accesses is further characterized by the access performed by the first port being a write, the access performed by the second port being a read, the first row address is the same as the second row address, and the first column address is the same as the second column address, the second port provides data written by the first port to the memory array as an output of the second port through circuitry not including either the first set of word lines and bit lines or the second set of word lines and bit lines.

3. The method of claim 2, wherein, when the performing the accesses is further characterized by the access performed by the first port being a write, the access performed by the third port being a read, the first row address is the same as the third row address, and the first column address is the same as the third column address, the third port provides data by accessing the array.

4. The method of claim 2, wherein, when the performing the accesses is further characterized by the access performed by the first port being a write, the access performed by the fourth port being a read, the first row address is the same as the fourth row address, and the first column address is the same as the fourth column address, the fourth port provides data by accessing the array.

5. The method of claim 1, wherein the step of providing is further characterized by the first phase being from a rising edge of the system clock to a falling edge of the system clock and the second phase being from the falling edge of the system clock to the next rising edge of the system clock.

6. The method of claim 5, wherein the performing the accesses uses a launch controller to determine if an access is to be performed for the first, second, third and fourth ports in response to the rising edge of the first cycle of the system clock.

7. The method of claim 6, further comprising outputting data on the first port after the rising edge that ends the second phase of the first cycle of the system clock in response to a second cycle of the first clock immediately following the cycle after the first cycle of the first clock.

8. The method of claim 1, wherein the performing the accesses is further characterized for the case of the accesses including a read through the first port in which the first cycle of the system clock is entered during a first cycle of the first clock and a result of the read is available on the first port on the beginning of the third cycle of the first port clock after the applying of the first port clock.

9. The method of claim 1, wherein the providing is further characterized as providing a first row decoder coupled to the first port and the third port and to the word lines of the first set of word lines and bit lines and a second row decoder coupled to the second port and the fourth port and to the word lines of the second set of word lines and bit lines.

10. The method of claim 9, wherein the performing the accesses is further characterized by the first row decoder selecting a word line, based on the first row address, of the first set of word lines and bit lines during the first phase of the first cycle and selecting a word line, based on the third row address, of the first set of word lines and bit lines during the second phase of the first cycle.

11. A memory system, comprising:
an array of memory cells coupled to a first set of word lines and bit lines and a second set of word lines and bit lines;
column circuitry coupled to the bit lines of the first and second sets;
row decoders coupled to the word lines of the first and second sets;
a first port, responsive to a first clock and a master clock, that receives a first row address and a first column address and has a first input circuit and a first output circuit;
a second port, responsive to a second clock and the master clock, that receives a second row address and a second column address and has a second input circuit and a second output circuit;
a third port, responsive to a third clock and the master clock, that receives a third row address and a third column address and has a third input circuit and a third output circuit; and
a fourth port, responsive to a fourth clock and the master clock, that receives a fourth row address and a fourth column address and has a fourth input circuit and a fourth output circuit;
wherein:
for each cycle of the master clock there is a first phase and a second phase;
during the first phase, when the first row address is different than the second row address, the first port accesses the memory array using the first set through the row decoders and the column circuitry and the second port accesses the memory array using the second set through the row decoders and the column circuitry; and
during the second phase, when the third row address is different than the fourth address, the third port accesses the memory array using the first set through the row decoders and the column circuitry and the fourth port accesses the memory array using the second set through the row decoders and the column circuitry.

12. The memory system of claim 11, wherein the first row address is read by the first port at a beginning of a first cycle of the first clock that immediately precedes the first phase.

13. The memory system of claim 12, wherein, when the access is a read, data is output by the first port at a beginning of a third cycle of the first clock immediately following the first cycle of the first clock.

14. The memory system of claim 12, wherein:
the second row address is read by the second port at a beginning of a first cycle of the second clock that immediately precedes the first phase; and
when:
the access performed by the first port is a write;
the access performed by the second port is a read;
the first row address is the same as the second row address; and
the first column address is the same as the second column address,
the second port provides data written by the first port to the memory array as an output of the second port through circuitry not including either the first set of word lines and bit lines or the second set of word lines and bit lines.

15. The memory system of claim 11, wherein during the first phase when the first row address is the same as the second row address, the first port and the second port use a word line of the first set of word lines and bit lines that is selected by the first row address to access the memory array.

16. The memory system of claim 11, wherein the master clock has a frequency at least as great as that of the first, second, third, and fourth clocks.

17. The memory system of claim 11, wherein:
when:
the access performed by the third port is a write;
the access performed by the fourth port is a read;

the third row address is the same as the fourth row address; and the third column address is the same as the fourth column address, the fourth port provides data written by the third port to the memory array as an output of the fourth port through circuitry not including either the first set of word lines and bit lines or the second set of word lines and bit lines.

18. A method of operating a multiport asynchronous memory having a memory array accessed in response to a master clock, which has a first phase and a second phase for each cycle, through a first set of word lines and bit lines and a second set of word lines and bit lines, comprising:

using a first port to access the memory array during the first phase of the master clock through the first set of word lines and bit lines responsive to a first row address and a first column address clocked by a first clock;

using a second port to access the memory array during the first phase of the master clock through the second set of word lines and bit lines responsive to a second row address and a second column address clocked by a second clock when the second row address is different from the first row address;

using a third port to access the memory array during the second phase of the master clock through the first set of word lines and bit lines responsive to a third row address and a third column address clocked by a third clock; and using a fourth port to access the memory array during the second phase of the master clock through the second set of word lines and bit lines responsive to a fourth row address and a fourth column address clocked by a fourth clock when the fourth row address is different from the third row address.

19. The method of claim 18, wherein when access is a read and the first address is the same as the second address, the using the second port is further characterized by using the word lines of the first set of word lines and bit lines.

20. The method of claim 18, wherein when the access for the first port is a write and the access for the second port is a read, the using the second port is further characterized as using circuitry other than either the first set of word lines and bit lines or the second set of word lines and bit lines.

* * * * *